United States Patent
Yomogita

(10) Patent No.: US 9,521,767 B2
(45) Date of Patent: Dec. 13, 2016

(54) DISPLAY DEVICE

(71) Applicant: MINEBEA CO., LTD., Kitasaku-gun, Nagano (JP)

(72) Inventor: Yasukazu Yomogita, Sagamihara (JP)

(73) Assignee: Minebea Co., Ltd., Nagano (JP)

( * ) Notice: Subject to any disclaimer, the term of this patent is extended or adjusted under 35 U.S.C. 154(b) by 63 days.

(21) Appl. No.: 14/165,828

(22) Filed: Jan. 28, 2014

(65) Prior Publication Data

US 2014/0340851 A1 Nov. 20, 2014

(30) Foreign Application Priority Data

May 20, 2013 (JP) ................................. 2013-106012

(51) Int. Cl.
| | |
|---|---|
| H05K 7/16 | (2006.01) |
| G06F 1/16 | (2006.01) |
| H05K 5/00 | (2006.01) |
| H05K 5/02 | (2006.01) |
| B60K 35/00 | (2006.01) |
| B60R 11/02 | (2006.01) |
| H05K 7/00 | (2006.01) |
| B60R 11/00 | (2006.01) |

(52) U.S. Cl.
CPC ............. *H05K 5/0217* (2013.01); *B60K 35/00* (2013.01); *B60R 11/0235* (2013.01); *G06F 1/1601* (2013.01); *G06F 1/1616* (2013.01); *G06F 1/1624* (2013.01); *H05K 5/0017* (2013.01); *B60R 2011/0094* (2013.01)

(58) Field of Classification Search
CPC ............. B60R 11/0235; B60R 2300/00; B60R 2300/205; B60R 2300/207; G06F 1/1601; G06F 1/1616; G06F 1/1624

USPC .......... 361/725, 679.21, 728, 741, 756, 802; 40/593; 359/13, 630, 631, 632; 345/7; 312/22–30, 319.2, 319.5, 319.6, 319.7; 348/837; 725/75, 76; 248/919; 296/37.8, 296/24.34

See application file for complete search history.

(56) References Cited

U.S. PATENT DOCUMENTS

| | | | | |
|---|---|---|---|---|
| 5,237,455 A | * | 8/1993 | Bordo | ................ G02B 27/0101 |
| | | | | 359/602 |
| 7,125,063 B2 | * | 10/2006 | Kawamoto | ............... B60R 7/04 |
| | | | | 296/24.34 |

(Continued)

FOREIGN PATENT DOCUMENTS

| | | |
|---|---|---|
| JP | 62-20040 U | 2/1987 |
| JP | 04-314643 A | 11/1992 |

(Continued)

OTHER PUBLICATIONS

Office Action issued on Sep. 6, 2016, in the corresponding Japanese patent application.

*Primary Examiner* — Binh Tran

(74) *Attorney, Agent, or Firm* — Carrier Blackman & Associates, P.C.; William D. Blackman; Anne G. Sabourin

(57) ABSTRACT

A display device is provided and includes: a display portion; a storage member configured to house the display portion and including an opening through which the display portion passes; a plurality of cover members configured to cover the opening and to travel from the opening to a region of the storage member adjacent to the opening so as to be folded up and overlapped with each other at the region; and travel control means configured to cause the plurality of cover members to transfer to a first condition in which the opening is closed by the plurality of cover members and also to a (Continued)

second condition in which the plurality of cover members are folded up and overlapped with each other.

7 Claims, 33 Drawing Sheets

(56) References Cited

U.S. PATENT DOCUMENTS

| | | | | |
|---|---|---|---|---|
| 7,794,000 | B2 * | 9/2010 | Ichimaru | B60N 3/102 248/311.2 |
| 2002/0166273 | A1 | 11/2002 | Nakamura et al. | |

FOREIGN PATENT DOCUMENTS

| | | | |
|---|---|---|---|
| JP | 2002-331855 | A | 11/2002 |
| JP | 2006-123883 | A | 5/2006 |
| JP | 2010-143703 | A | 7/2010 |
| JP | 2012-061987 | A | 3/2012 |
| JP | 2012-254707 | A | 12/2012 |
| JP | 2013-154817 | A | 8/2013 |
| JP | 2014-201104 | A | 10/2014 |

* cited by examiner

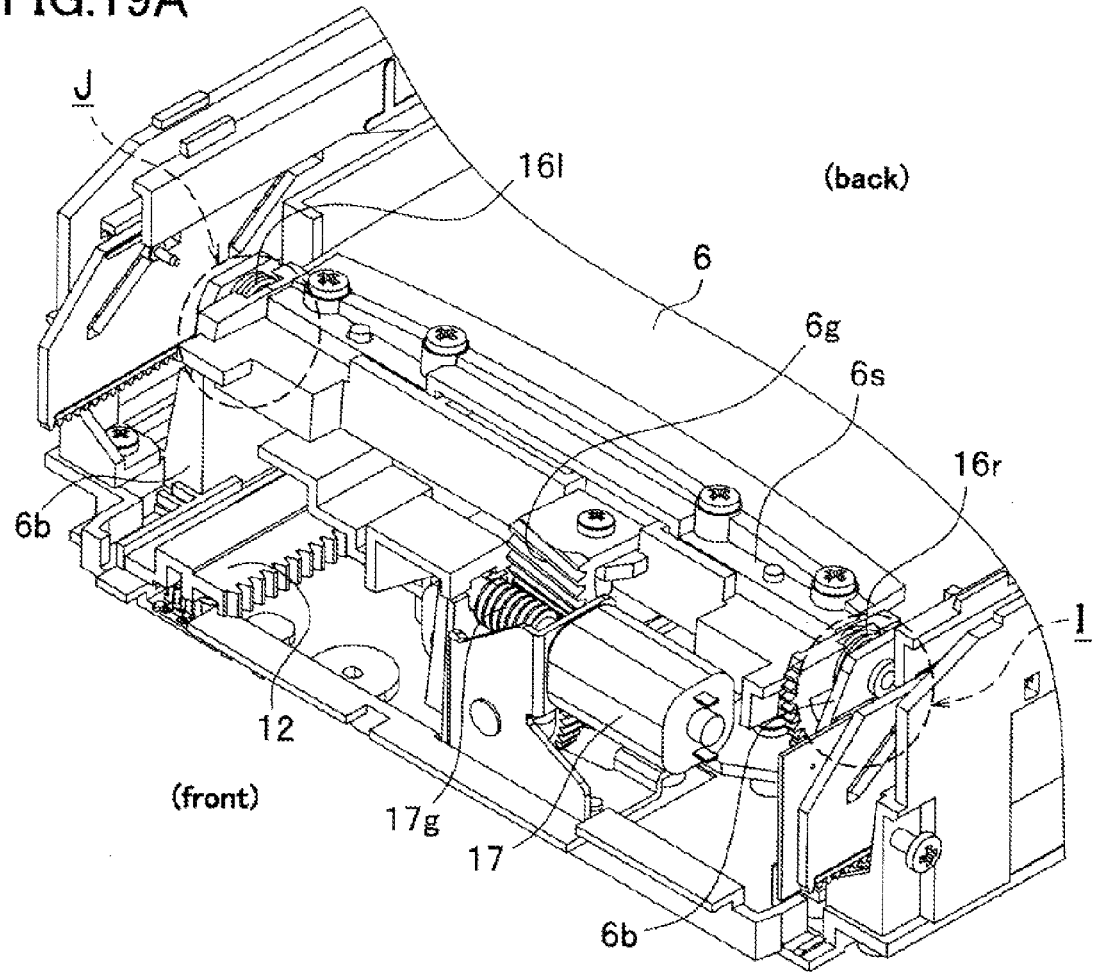

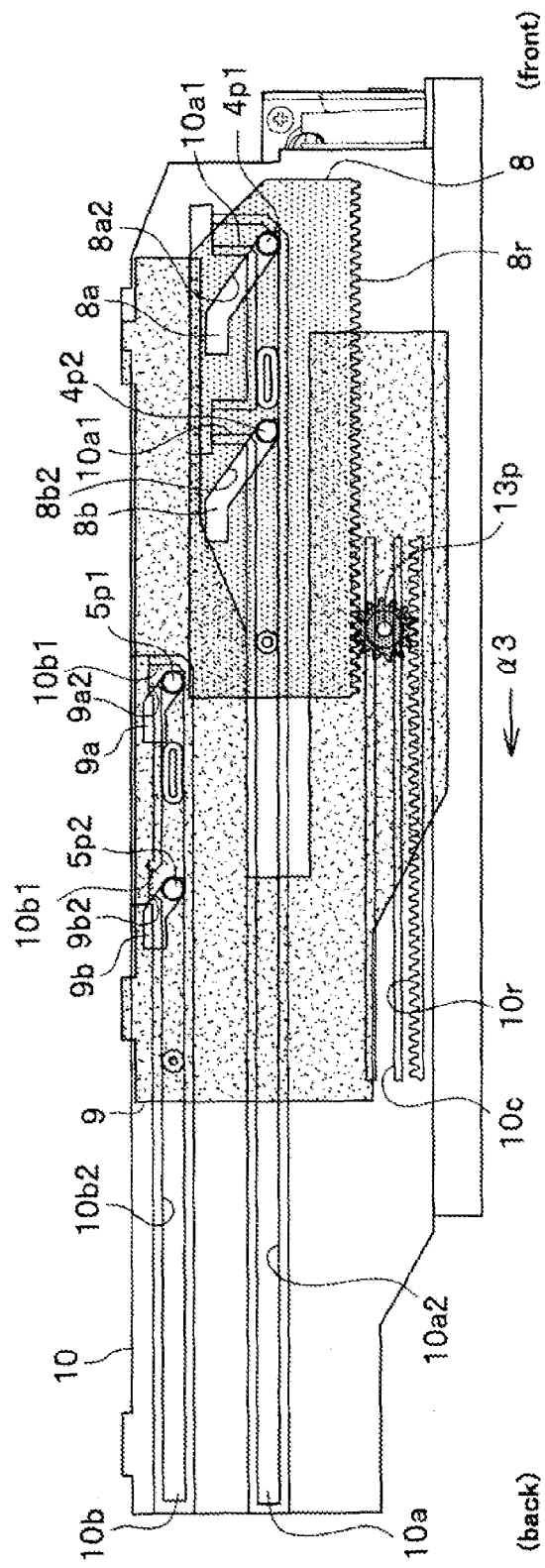
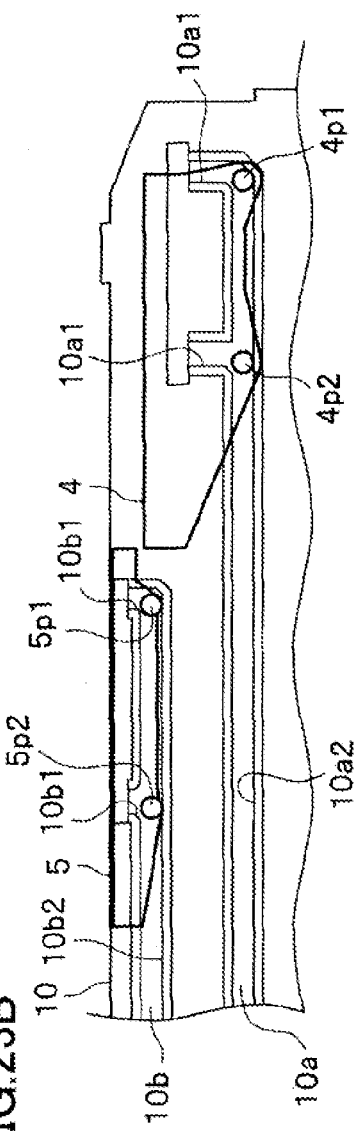
FIG.23A
FIG.23B

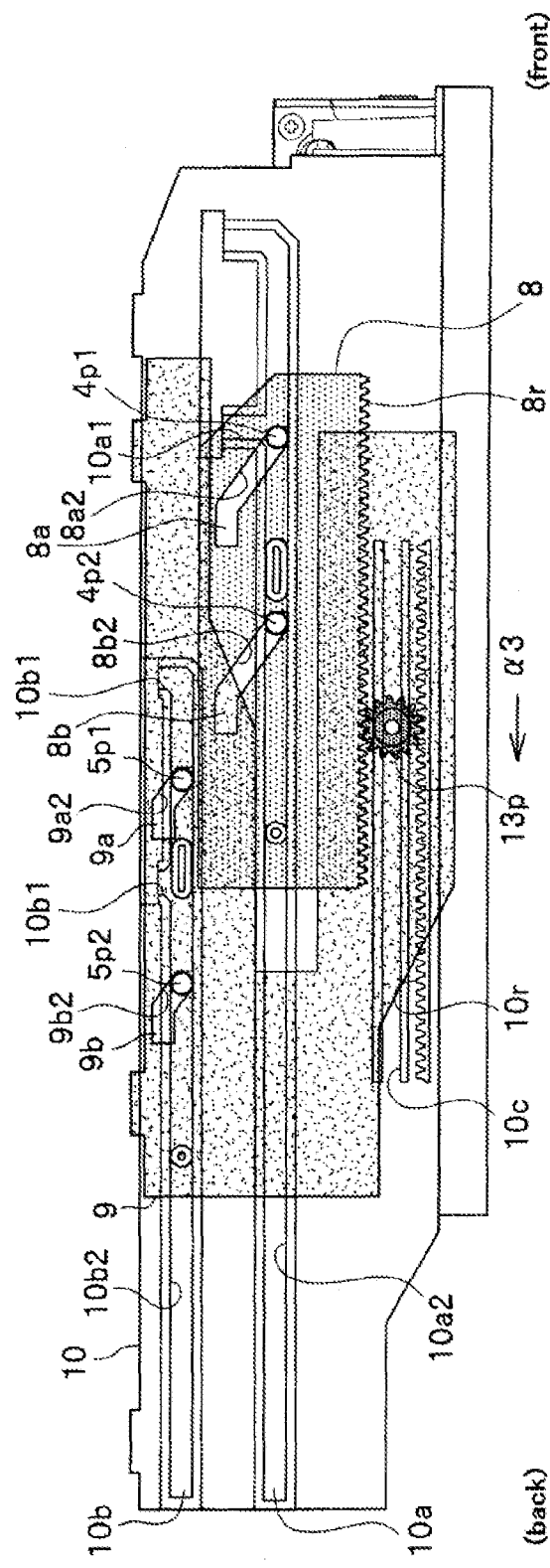

DISPLAY DEVICE

BACKGROUND OF THE INVENTION

1. Field of the Invention

The present invention relates to a display device in which a cover for a head-up display/a pop-up display is opened and closed.

2. Description of the Related Art

There has conventionally been available a display device which is put in an automobile dashboard and which operates such that the image of information necessary for a driver and so on is projected on a combiner raised up through an opening.

In the display device described above, a cover to cover up the opening which is provided for allowing the combiner to rise up is required in order to prevent foreign substances or dust from getting inside the display device when the combiner is retracted for storage.

In the display device described above, however, since the cover to cover up the opening is composed of one piece, a large space must be provided for lodging the cover for allowing the combiner to rise up, thus increasing the depth dimension of the device. Specifically, when the cover to cover up the opening is composed of one piece, a sliding distance for retracting the cover is large, thus increasing the dimension of a drive structure (the length of a rack). At the same time, the length of the storage for the cover is also increased, and therefore the depth dimension of the whole device is increased, which results in that the device fails to appropriately fit in the automobile dashboard. Specifically, for example, it can happen that the display device invades into a space allocated for other instruments.

In order to overcome the problem of the display device described above, Japanese Patent Application Laid-Open No. 2002-331855 discloses a display device in which a cover to cover up an opening is divided into two sections (lids).

The display device described therein is structured such that while one end of the lid is raised above a dashboard, the other end of the lid travels along guide grooves over the opening toward the back of a vehicle, whereby the two lids of the cover covering up the opening are folded up for retraction at a side of the opening thus clearing the opening, and the opening covered up by the lids of the cover is opened completely.

In the display device described above in Japanese Patent Application Laid-Open No. 2002-331855, since the lid protrudes above the device when the opening is opened, a space for accommodating the lids must be provided above the device. Also, it can happen that when the opening is opened, the lids of the cover interrupt the vision of the driver depending on the driver's posture.

SUMMARY OF THE INVENTION

The present invention has been made in view of the problems described above, and it is an object of the present invention to provide a display device which can be reduced in dimension, in which the opening and closing action of a cover can be synchronized, and which has a high merchantability.

In order to achieve the object described above, according to one aspect of the present invention, there is provided a display device which includes: a display portion; and a storage member configured to house the display portion and including an opening through which the display portion passes, wherein the display device further includes: a plurality of cover members configured to cover the opening and to travel from the opening to a region of the storage member adjacent to the opening so as to be folded up and overlapped with each other at the region; and travel control means configured to cause the plurality of cover members to transfer to a first condition in which the opening is closed by the plurality of cover members and also to a second condition in which the plurality of cover members are folded up and overlapped with each other.

According to the configuration described above, since the plurality of cover members are folded up and overlapped with each other at the region adjacent to the opening, the depth dimension can be reduced thus downsizing the device. Also, since the cover is divided into a plurality of sections, the load is spread thus enabling a smooth action.

In the one aspect of the present invention, the travel control means may move the plurality of cover members at respective different speeds.

According to the configuration described above, since the plurality of divided cover members are moved at respective different speeds, the plurality of cover members located at respective different positions can be moved to a storage place at the same timing when the opening is being opened. Also, the plurality of cover members located at respective different positions in the storage place can be moved to a closing place at the same timing.

In the one aspect of the present invention, the travel control means may move the plurality of cover members from the second condition to the first condition at the same timing and also from the first condition to the second condition at the same timing.

According to the configuration described above, since the plurality of cover members are moved from the second condition to the first condition at the same timing and also from the first condition to the second condition at the same timing, the appearance of the action can be enhanced, thus increasing the commodity value.

In the one aspect of the present invention, when the plurality of cover members are disposed in the second condition, a cover member with a long travel distance of the plurality of cover members may be located below a cover member with a short travel distance.

According to the configuration described above, the travel distances of component members of the plurality of cover members can be reduced, thereby downsizing the device. Also, since the travel tracks of the plurality of cover members do not intersect with one another, the structure can be simplified.

In the one aspect of the present invention, the display device may include biasing means configured to bias the display portion in a retraction direction when the display portion is raised up.

According to the configuration described above, since the display portion, when raised up, is biased in a retraction direction, the display portion is stabilized and suppressed from vibrating due to disturbance.

In the one aspect of the present invention, the display device may further include a rotary cover member configured to rotate to thereby open and close a part of the opening.

According to the configuration described above, a rotary cover member may be included in addition, the dimensions of the plurality of cover members can be reduced, thus further downsizing the device. Also, since the rotary cover member moves in a rotation motion, the action is highly reliable.

In the one aspect of the present invention, the display device may include a rotation opening and closing means configured to be rotated by a travel means to open and close one of the plurality of cover members thereby closing the part of the opening.

According to the configuration described above, since there may be provided the rotation opening and closing means which is configured to be rotated by a travel means to open and close one of the plurality of cover members thereby closing the part of the opening, the number of component members can be reduced thus reducing the cost.

In the one aspect of the present invention, each of the plurality of cover members may have a surface area smaller than a surface area of the opening, and a total surface area of the plurality of cover members may be larger than the surface area of the opening.

According to the configuration described above, since each of the plurality of cover members has a surface area smaller than a surface area of the opening, the dimension of the device can be reduced thus downsizing the device.

In the one aspect of the present invention, the display device may further include: a first drive source to drive the plurality of cover members via the travel control means; and a second drive source disposed independent from the first drive source and configured to drive the display portion.

According to the configuration described above, since the display device further includes: the first drive source to drive the plurality of cover members via the travel control means; and the second drive source disposed independent from the first drive source and configured to drive the display portion, the plurality of cover members and display portion can be driven independently from each other. Therefore, the drive structure is simple.

According to another aspect of the present invention, there is provided a display device which includes: an opening; and a combiner which, in use, is raised up through the opening with information displayed thereon and which, out of use, is retracted and stored, wherein the display device further includes: a plurality of lids which, in use, are configured to be folded up and stored by cover opening action to thereby open the opening and which, out of use, are configured to close the opening; and opening and closing drive structure configured to open and close the plurality of lids at respective different speeds.

According to the configuration described above, since the cover is divided into the plurality of lids and therefore can be retracted and overlapped with one another for storage, especially the depth dimension can be reduced thus downsizing the device. Also, since the cover is divided into a plurality of sections, the load is spread thus enabling a smooth action.

Further, since the plurality of divided cover members are moved at respective different speeds, the plurality of cover members located at respective different positions can be moved to a storage place at the same timing when the opening is opened. Also, the plurality of cover members located at respective different positions in the storage place can be moved to a closing position at the same timing.

In the other aspect of the present invention, the plurality of lids may include: a first lid, a second lid, and also a third lid which is disposed closer to an end portion of the opening than the first and second lids and which opens and closes a part of the opening by rotation action.

According to the configuration described above, since the display device includes: the third lid in addition to the first lid and the second lid, the dimensions of the first lid and the second lid can be reduced, thus further downsizing the device. Also, since the third lid moves in a rotation motion, the action is highly reliable.

In the other aspect of the present invention, the display device may include: a support member configured to rotatably support the third lid and having a drive boss; an elastic member configured to bias the third lid in an opening direction; and a closing action portion configured, when the first and second lids are closed, to move the drive boss of the support member to thereby close the part of opening by the third lid.

According to the configuration described above, since the closing action portion is provided which, when the first and second lids are closed, moves the drive boss of the support member to thereby close the part of the opening by the third lid, the number of component members can be reduced, thus reducing the cost.

Thus, according to the present invention, the device can be downsized, and the action of opening and closing cover lids can be synchronized, thus providing a display device with an enhanced commodity value.

BRIEF DESCRIPTION OF THE DRAWINGS

FIG. 19A is a perspective view of a support structure of the combiner seen obliquely from the front upper side;

FIG. 23A is a schematic side view of an operation of the first and second cams and the pinion, when the opening closed by the first lid and the second lid is being opened;

FIG. 23B is a schematic side view of position of the first lid and the second lid at the operation of FIG. 23A;

FIG. 24A is a schematic side view of an operation of the first and second cams and the pinion, when the opening closed by the first lid and the second lid is being opened;

FIG. 24B is a schematic side view of position of the first lid and the second lid at the operation of FIG. 24A;

DETAILED DESCRIPTION OF THE INVENTION

Exemplary embodiments of the present invention will hereinafter be described with reference to the accompanying drawings.

Figure 1:
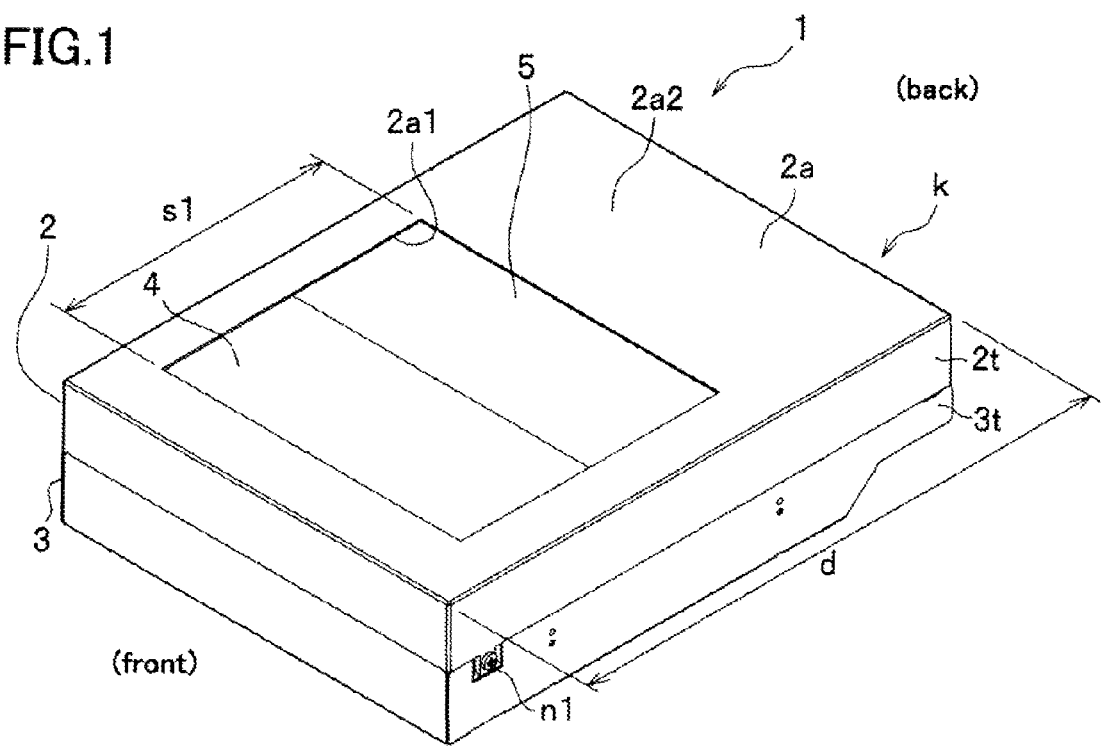
FIG. 1 is a perspective view of a display device according to a first embodiment of the present invention seen obliquely from a front upper side, when the display device is not in use such that a cover is closed.
Figure 2:
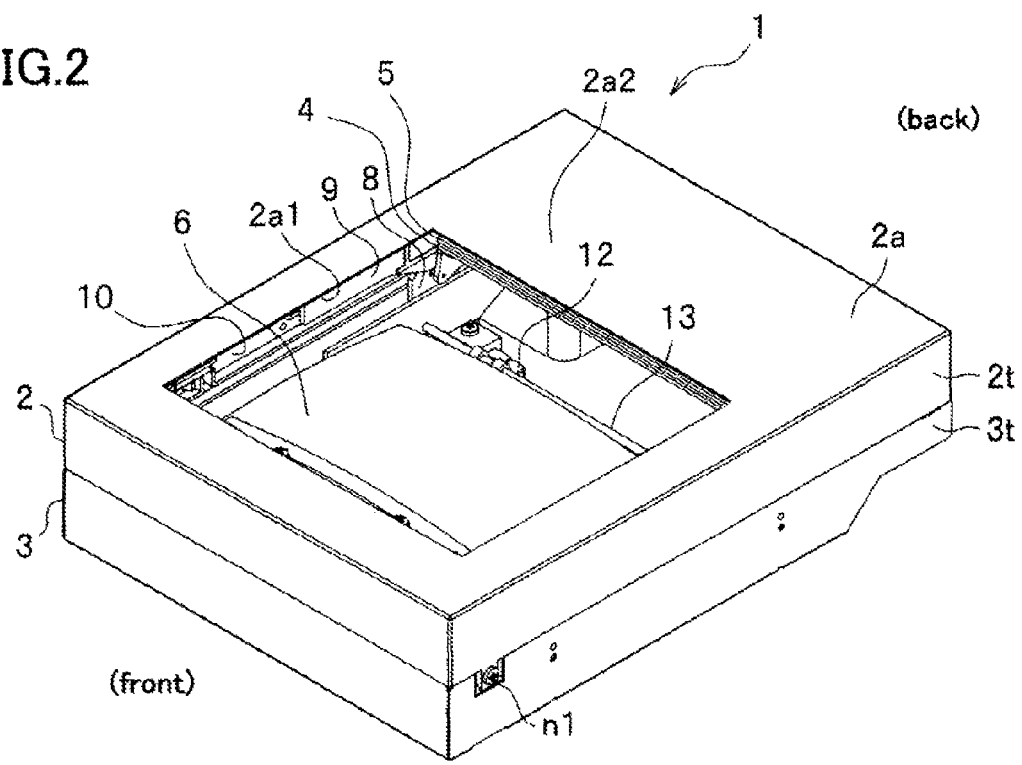
FIG. 2 is a perspective view of the display device shown in FIG. 1 seen obliquely from the front upper side, when the display device is not in use such that the cover is opened and that a combiner is retracted.

FIG. 1 perspectively shows a display device 1 according to a first embodiment of the present invention, seen obliquely from a front upper side, wherein an opening 2a1 is closed by a first section of cover (to be referred to as first lid) 4 and a second section of cover (to be referred to as second lid) 5 and the display device 1 is not in use. FIG. 2 perspectively shows the display device 1 seen obliquely from the front upper side, wherein the opening 2a1 is opened and the display device 1 is not in use such that a combiner 6 (as a display portion) is retracted. And, FIG. 3 perspectively shows the display device 1 seen from the upper side, wherein the display device is in use.

The display device 1 according to the first embodiment is installed in, for example, an automobile dashboard and projects information necessary for driving a vehicle (refer to FIG. 3) on the combiner (display portion) 6. The combiner 6 is made of a resin material, for example polycarbonate, including several layers of reflective coating, and a user sees a virtual image which is displayed on the combiner 6 by a light source arranged below an upper surface plate 2a.

The display device 1 includes a chassis (storage member) k having a flat rectangular parallelepiped shape and including an upper case (storage member) 2 and a lower case (storage member) 3 and is enclosed in the flat rectangular cubic chassis k. The upper case 2 and the lower case 3 are fixedly attached to each other in such a manner that a pan head small screw n1 with a cross slot is put through a through-hole of the upper case 2 and is inserted into a female screw formed at the lower case 3.

The lower case 3 is formed to have a shape of a flat rectangular parallelepiped having an open upper side facing the upper case 2.

The upper case 2 is formed to have an open lower side facing the lower case 3 and is structured such that the opening 2a1 which is opened for allowing the combiner 6 to rise up and to be retracted is formed at the aforementioned upper surface plate 2a. In order to allow the combiner 6 to rise up, the opening 2a of the upper surface plate 2a is formed to have a projected area equal to or larger than an area of the combiner 6.

When the display device 1 is not in use, the opening 2a1 is closed by the first lid (cover member, lid, cover member with a longer travel distance) 4 which has a depth dimension s2 measuring shorter than a depth dimension s1 of the opening 2a1 (refer to FIG. 4) and by the second lid (cover member, lid, cover member with a shorter travel distance) 5 which has a depth dimension s3 measuring shorter than the depth dimension s1 of the opening 2a1 (refer to FIG. 5).

When display device 1 is brought into use, the first lid 4 and the second lid 5 move downward, then travel in parallel under the upper surface plate 2a and are retracted and stored as shown in FIG. 2, wherein the first lid 4 is moved below the second lid 5. Then, the second lid 5 and the first lid 4 located below the second lid 5 move rearward and are retracted and stored under a rear portion 2a2 of the upper surface plate 2a.

Figure 3:
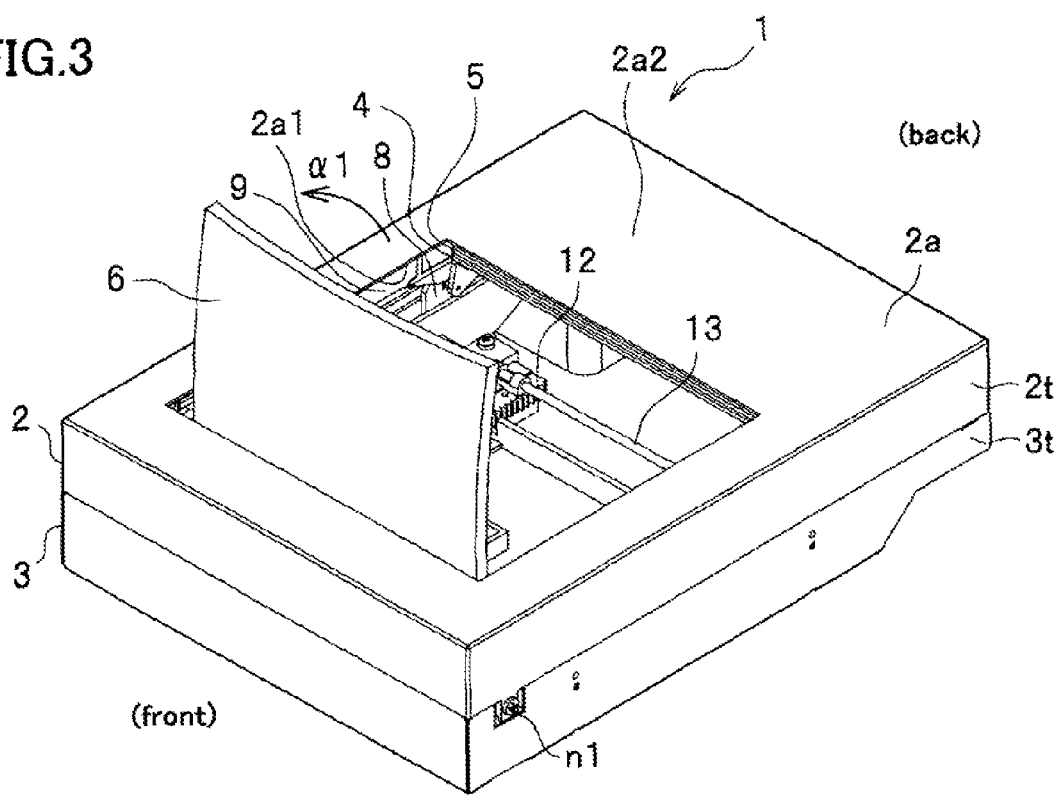
FIG. 3 is a perspective view of the display device shown in FIG. 1 seen from an upper side, when the display device is in use.

Thus, the combiner 6 retracted appears through the opening 2a1 of the upper surface plate 2a. And, the combiner 6 turns on a front axis so as to be raised up in a direction indicated by an arrow α1 shown in FIG. 3, whereby the display device 1 comes in use as shown in FIG. 3.

Two motors are used in the display device 1, wherein a first motor (travel control means, opening and closing drive structure, motor, first drive source) 7 (refer to FIG. 7) acts to open and close the first lid 4 and the second lid 5, and a second motor 17 (refer to FIG. 8) acts to raise up the combiner 6.

First Lid 4

Figure 4A:
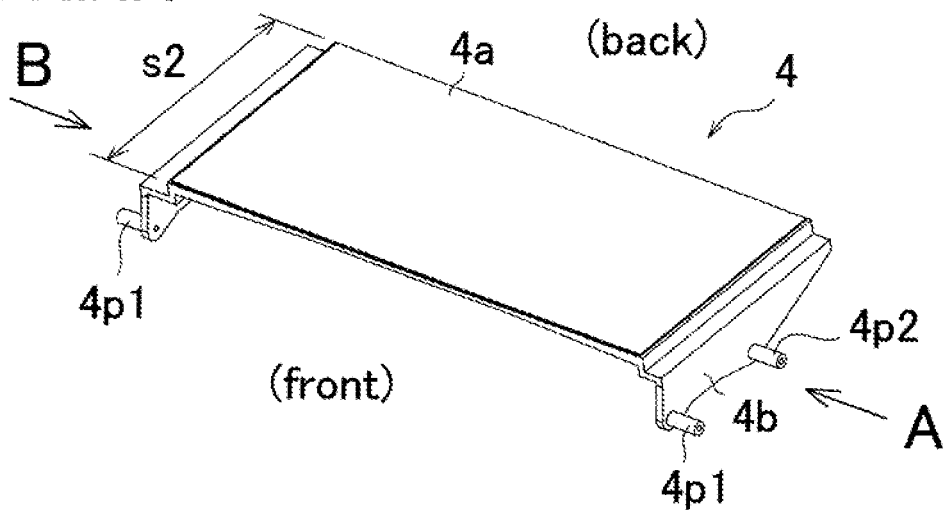
FIG. 4A is a perspective view of a first lid of the cover seen obliquely from the front upper side.
Figure 4B:
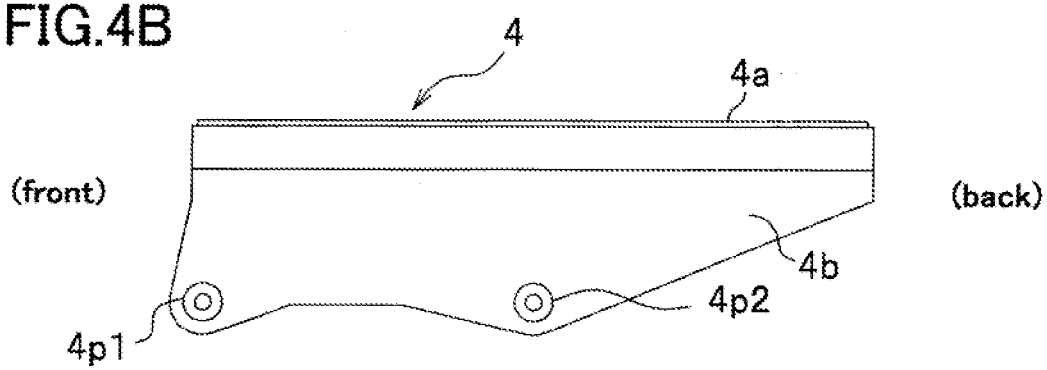
FIG. 4B is a plan view of the first lid seen in a direction indicated by an arrow A shown in FIG. 4A.
Figure 4C:
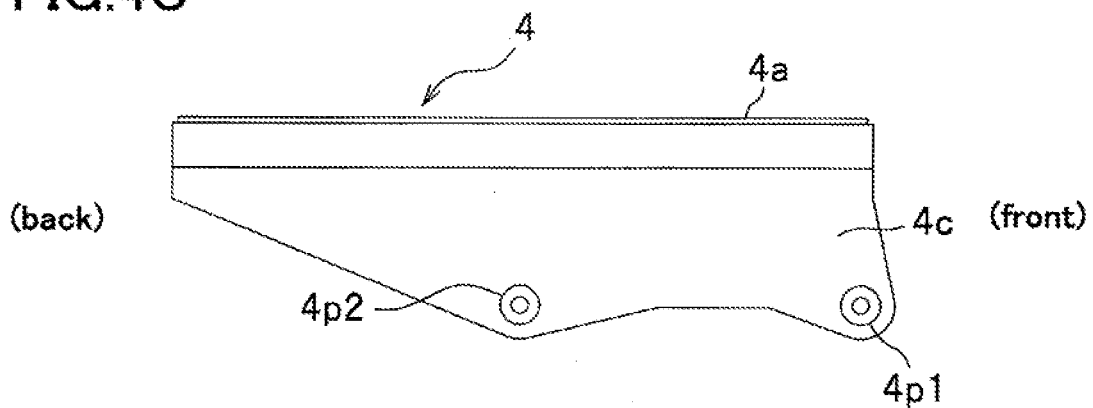
FIG. 4C is a plan view of the first lid seen in a direction indicated by an arrow B shown in FIG. 4A.

FIG. 4A perspectively shows the first lid 4 viewed obliquely from the front upper side, FIG. 4B shows the first lid 4 viewed in a direction indicated by an arrow A shown in FIG. 4A, and FIG. 4C shows the first lid 4 viewed in a direction indicated by an arrow B shown in FIG. 4A.

The first lid 4 has a substantially flat square C shape oriented sideways when viewed from a front side and includes a horizontal top plate 4a and side plates 4b and 4c extending downward respectively from both side ends of the top plate 4a. The top plate 4a has a surface area smaller than the area of the opening 2a1, and the total area of the surface areas of the top plate 4a of the first lid 4 and a top plate 5a (to be described later, refer to FIG. 5A) of the second lid 5 is set larger than the area of the opening 2a1.

As shown in FIGS. 4A and 4B, a first front boss (first boss) 4p1 and a first rear boss (first boss) 4p2, which project outward, are formed at the side plate 4b.

As shown in FIGS. 4A and 4C, a first front boss (first boss) 4p1 and a first rear boss (first boss) 4p2, which project outward, are formed at the side plate 4c.

Second Lid 5

Figure 5A:
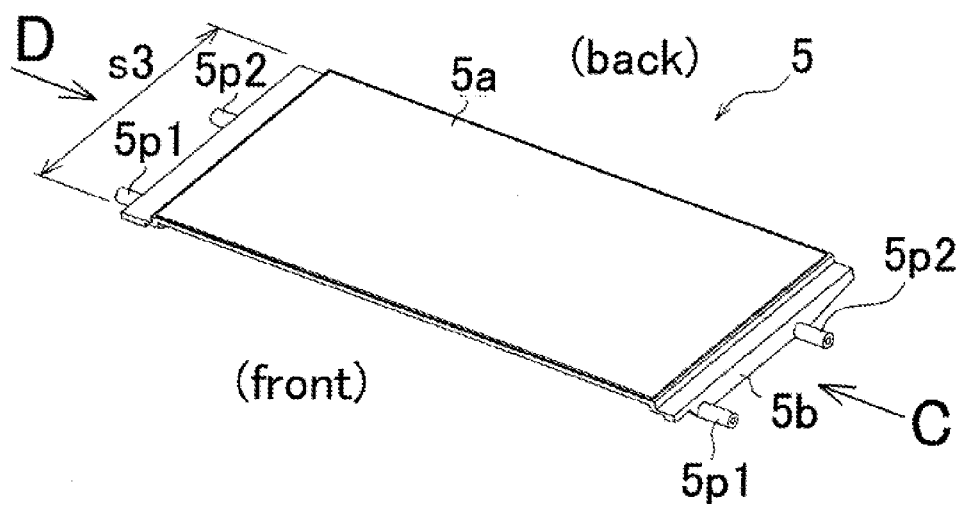
FIG. 5A is a perspective view of a second lid of the cover seen obliquely from the front upper side.
Figure 5B:
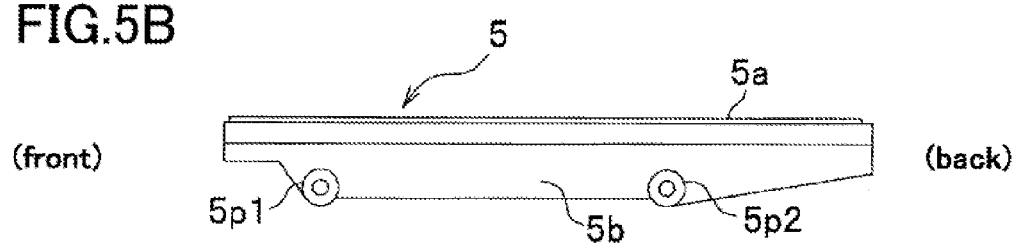
FIG. 5B is a plan view of the second lid seen in a direction indicated by an arrow C shown in FIG. 5A.

FIG. 5A perspectively shows the second lid 5 viewed obliquely from the front upper side, FIG. 5B shows the second lid 5 viewed in a direction indicated by an arrow C shown in FIG. 5A, and FIG. 5O shows the second lid 5 viewed in a direction indicated by an arrow D shown in FIG. 5A.

The second lid 5 has a substantially flat square C shape oriented sideways when viewed from a front side and includes a horizontal top plate 5a and side plates 5b and 5c extending downward respectively from both side ends of the top plate 5a. The top plate 5a has a surface area smaller than the area of the opening 2a1, and, as described above, the total area of the surface areas of the top plate 4a of the first lid 4 and the top plate 5a of the second lid 5 is set larger than the area of the opening 2a1.

As shown in FIGS. 5A and 5B, a second front boss (second boss) 5p1 and a second rear boss (second boss) 5p2, which project outward, are formed at the side plate 5b.

Figure 5C:
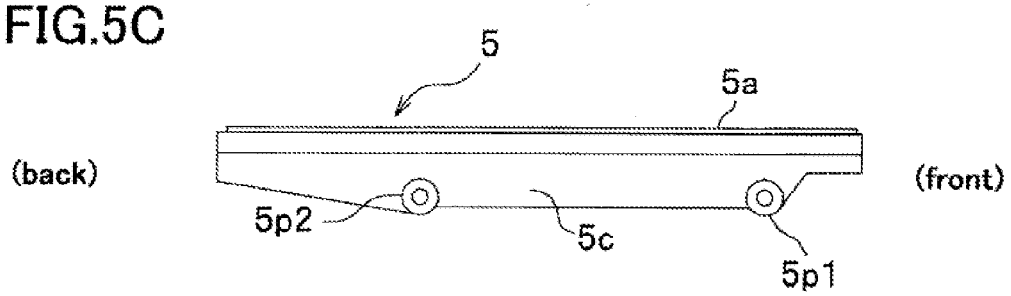
FIG. 5C is a plan view of the second lid seen in a direction indicated by an arrow D shown in FIG. 5A.

As shown in FIGS. 5A and 5C, a second front boss (second boss) 5p1 and a second rear boss (second boss) 5p2, which project outward, are formed at the side plate 5c.

First Motor 7 and its Gear Train

Figure 6:
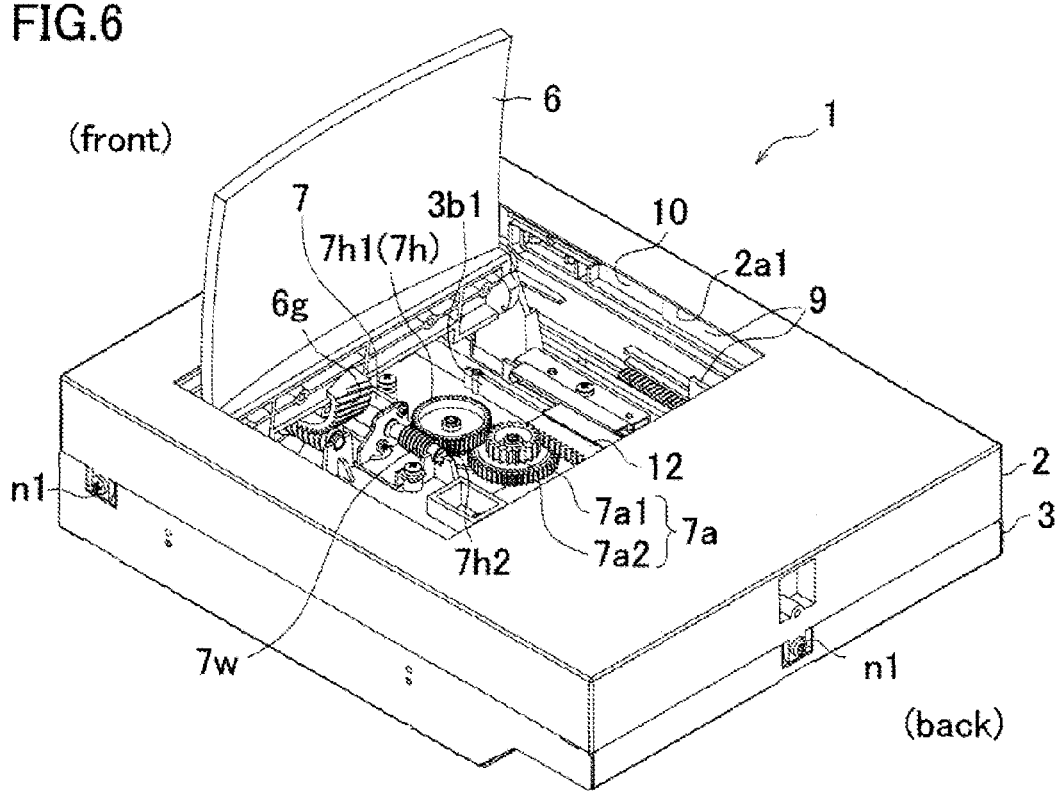
FIG. 6 is a perspective view of the display device seen obliquely from a rear upper side, when the first lid and the second lid are retracted and the combiner is raised up.
Figure 7:
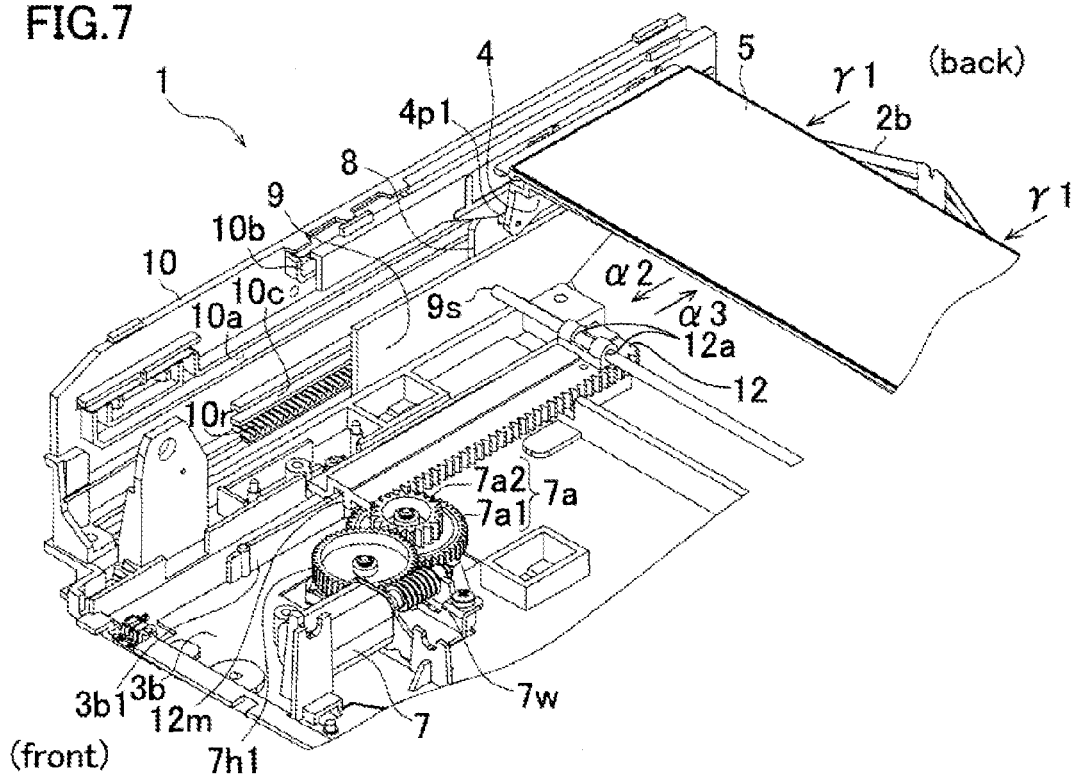
FIG. 7 is an enlarged perspective view of an internal structure of the display device seen obliquely from the front upper side, when the first lid and the second lid are retracted.

FIG. 6 perspectively shows the display device 1 viewed obliquely from a rear upper side, wherein the first lid 4 and the second lid 5 are retracted, and the combiner 6 is raised up. FIG. 7 perspectively shows in an enlarged manner an inside of the display device 1 viewed from the front upper side, wherein the first lid 4 and the second lid 5 are retracted. As shown in FIG. 7, the first lid 4 is retracted under the second lid 5.

In a front area of the display device 1, the first motor 7 which drives the first lid 4 and the second lid 5 to thereby open and close the opening 2a1 is fixed to a base 3b of the lower case 3.

A worm gear (first gear train) 7w is fixed to a shaft of the first motor 7, and a worm wheel (first gear train) 7h is engaged with the worm gear 7w.

A first spur gear (first gear train) 7h2 is integrally formed at a lower portion of the worm wheel 7h1. The worm wheel 7h1 and the first spur gear 7h2 are rotatably supported at the base 3b.

A second spur gear 7a1 is engaged with the first spur gear 7h2.

A third spur gear 7a2 is integrally formed at an upper portion of the second spur gear 7a1, and thus a spur gear (first gear train) 7a is structured. The spur gear 7a is rotatably supported at the base 3b.

As shown in FIG. 7, a rack (travel control means, opening and closing drive structure) 12 is provided and oriented in a front and rear direction of the display device 1 so as to be engaged with a third spur gear 7a2. A guide groove 12m is formed at a lower portion of the rack 12, and a guide rail 3b1 oriented along a front and rear direction of the base 3b fixed to the lower case 3 is put through the guide groove 12m, whereby the rack 12 is guided in the front and rear direction.

In the configuration described above, the rack 12 is caused to travel in parallel in the front and rear direction (direction indicated by arrows α2 and α3 shown in FIG. 7) such that a drive force of the first motor 7 is transferred via the worm gear 7w, the worm wheel 7h1 and the spur gear 7a. That is, the worm gear 7w, the worm wheel 7h and the spur gear 7a constitute the gear train of the first motor 7.

The rack 12 is a member to open and close the opening 2a1 shown in FIGS. 1 and 2 by means of the first lid 4 and the second lid 5.

When the first motor 7 is rotated for opening and closing the opening 2a1, the power of the first motor 7 is transferred to the rack 12 by means of the gear train.

As shown in FIG. 1, when the opening 2a1 is closed by moving the first lid 4 and the second lid 5 to the front, the rack 12 is moved toward the front (in the direction indicated by arrow α2 shown in FIG. 7) of the display device 1. On the other hand, as shown in FIG. 2, when the opening 2a1 is opened by moving the first lid 4 and the second lid 5 to the rear, the rack 12 is moved toward the rear (in the direction indicated by arrow α3 shown in FIG. 7) of the display device 1.

Also, a hole 12a for attaching a drive shaft 13 is formed at the rack 12, wherein the drive shaft 13 is rotatably put through the hole 12a so as to be oriented perpendicular to the travel direction (direction indicated by the arrows α2 and α3 shown in FIG. 7) of the rack 12. A pinion 13p is fixedly attached to each of both ends of the drive shaft 13 as shown in FIGS. 8 and 9.

Figure 8:
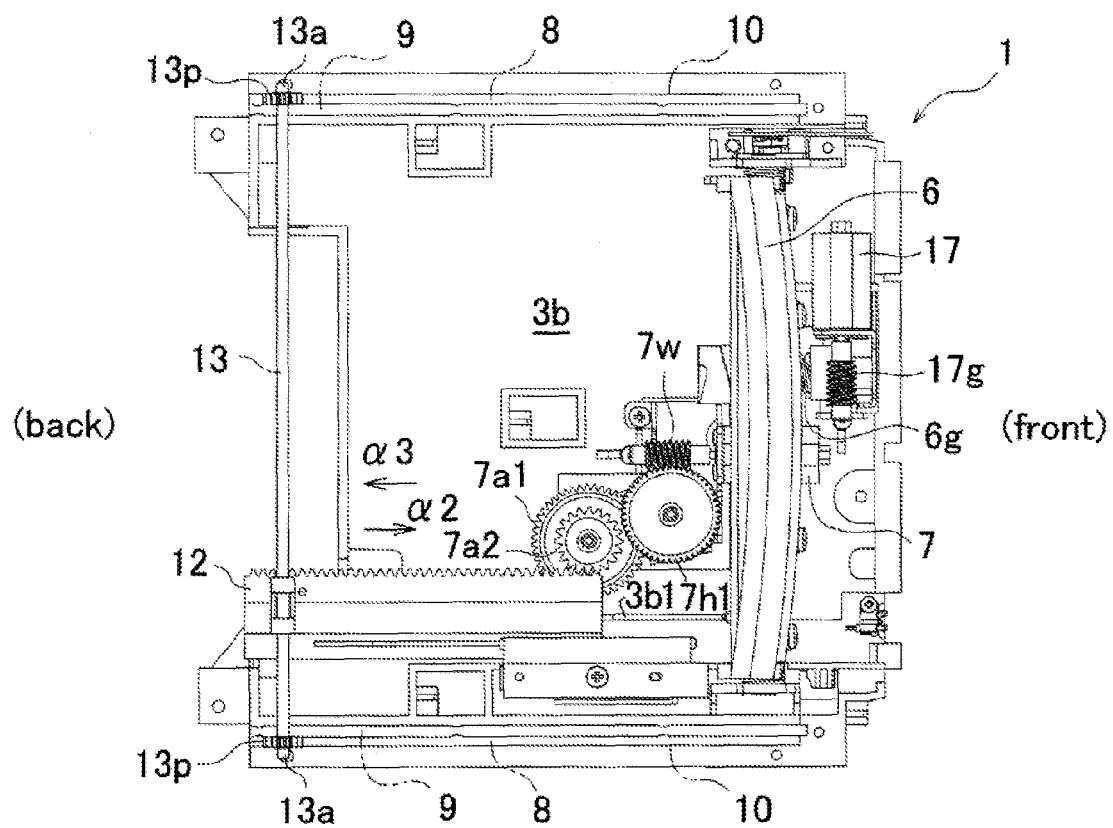
FIG. 8 is a plan view of the internal structure of the display device of FIG. 3 seen from the upper side.
Figure 9:
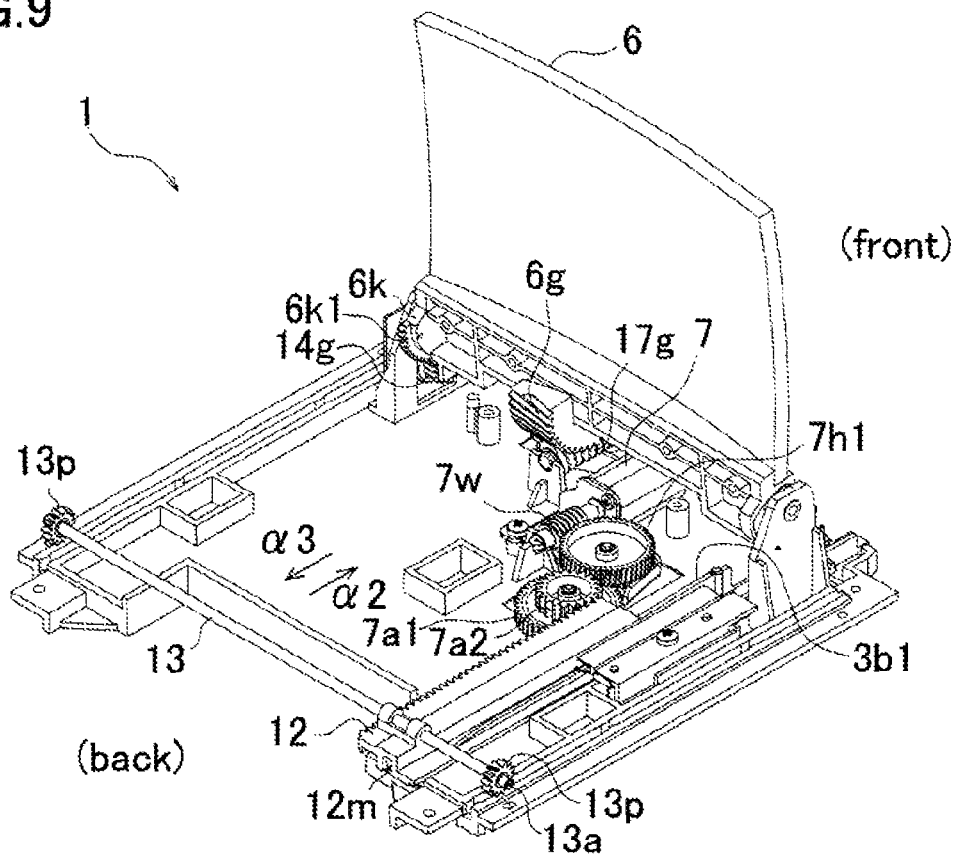
FIG. 9 is a perspective view of the internal structure of the display device of FIG. 3 seen obliquely from the rear upper side.

FIG. 8 shows an inside structure of the display device 1 of FIG. 3 seen from an upper side, and FIG. 9 perspectively shows the inside structure of the display device 1 of FIG. 3 seen obliquely from a rear upper side. In FIGS. 8 and 9, a first cam 8, a second cam 9 and a lid rail 10 (these are to be described later) are partly omitted for the purpose of better showing the inside structure of the display device 1.

First Cam 8, Second Cam 9, Lid Rail 10

As shown in FIG. 7, the second cam (travel control means, travel means, opening and closing drive structure) 9 to move the second lid 5, the first cam (travel control means, travel means, opening and closing drive structure) 8 to move the first lid 4 (refer to FIG. 1) and a couple of the lid rails 10 to guide the track of the opening and closing of the first lid 4 and the second lid 5 are provided in this order from the inward to the outward at each of both sides of the display device 1.

Thus, when viewed from the front of the display device 1, the second cam 9, the first cam 8, and the couple of lid rails 10 are provided in pairs at both sides so as to be symmetrically arranged in the horizontal direction. Therefore, description will be made of the second cam 9, the first cam 8, and the couple of lid rails 10 provided at one of the both sides, and description thereof provided at the other one of the both sides will be omitted.

Second Cam 9

Figure 10A:
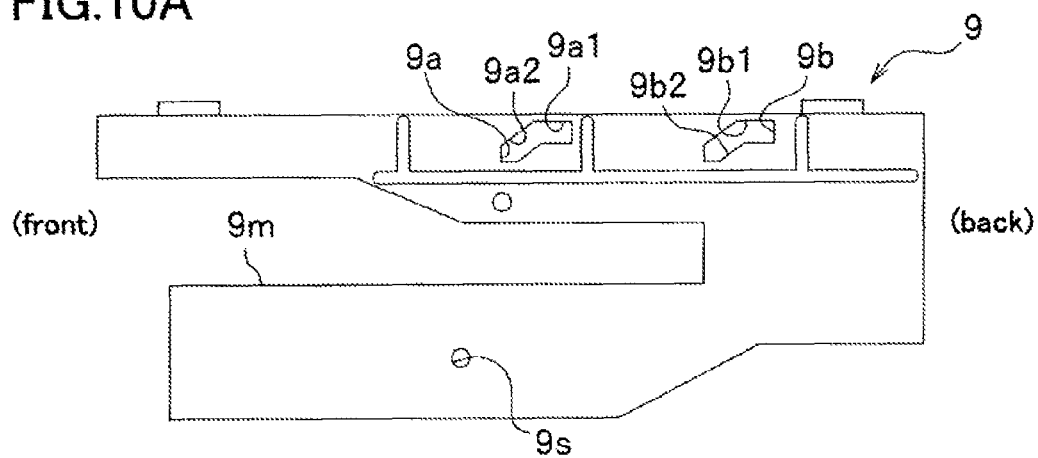
FIG. 10A is a plan view of a second cam seen from inside.
Figure 10B:
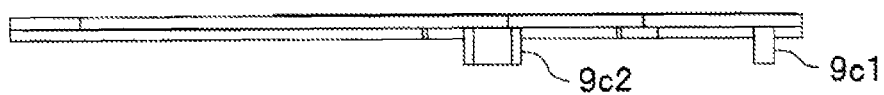
FIG. 10B is a plan view of the second cam seen from a lower side.
Figure 10C:
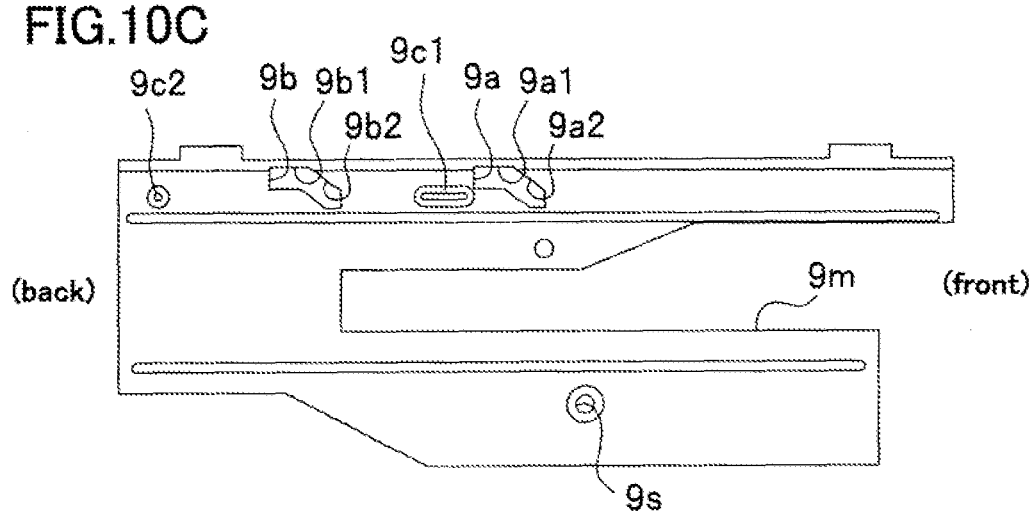
FIG. 10C is a plan view of the second cam seen from outside.
Figure 10D:
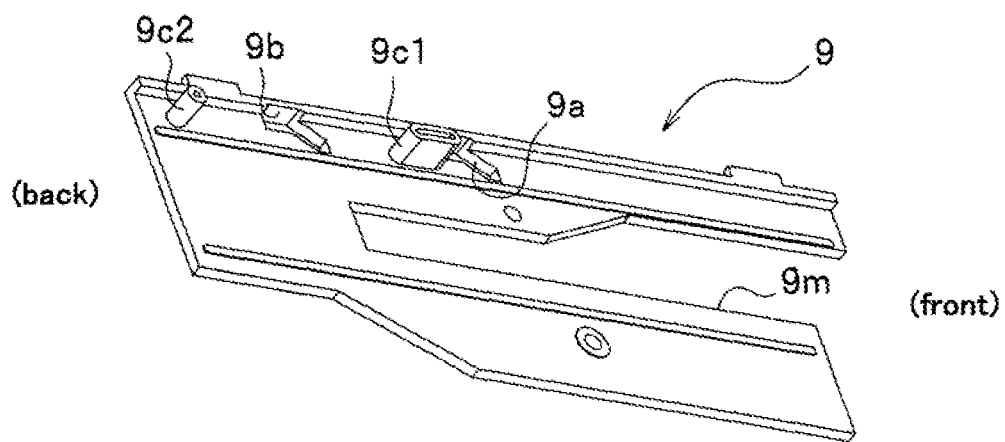
FIG. 10D is a perspective view of the second cam seen from a rear lower side.

FIG. 10A shows the second cam 9 viewed from the inside, FIG. 10B shows the second cam 9 viewed from a lower side, FIG. 10C shows the second cam 9 viewed from the outside, and FIG. 10D perspectively shows the second cam 9 viewed from the rear lower side.

The second cam 9 is a member to perform action of opening and closing the second lid 5 (refer to FIG. 1) and is formed to have a rectangular flat plate shape extending in the front and rear direction.

A shaft insertion hole (through-hole) 9s through which the drive shaft 13 supported by the rack 12 shown in FIG. 7 is inserted is formed at the second cam 9. The second cam 9 is caused to move by the drive shaft 13 in the front and rear direction based on the linear motion of the rack 12 of FIG. 7 moving in the front and rear direction (direction indicated by the arrows α2 and α3 shown in FIG. 7).

A second front guide groove (second cam groove) 9a to guide the front boss 5p1 (refer to FIG. 5) of the second lid 5, and a second rear guide groove (second cam groove) 9b to guide the rear boss 5p2 of the second lid 5 are formed at the second cam 9.

The second front guide groove 9a includes a parallel portion 9a1 formed horizontally, and an inclined descendent portion 9a2 formed to extend continuously from an end of the parallel portion 9a1 so as to be inclined downward. An angle made between the parallel portion 9a1 and the inclined descendent portion 9a2 can be arbitrarily determined, for example, 45 degrees.

The second rear guide groove 9b includes a parallel portion 9b1, and an inclined descendent portion 9a2 formed to extend continuously from an end of the parallel portion 9b1 so as to be inclined downward. An angle made between the parallel portion 9b1 and the inclined descendent portion 9b2 can be arbitrarily determined, for example, 45 degrees.

In this connection, it is more preferable if the angle between the parallel portion 9a1 and the inclined descendent portion 9a2 is set, as shown in FIGS. 10A and 10C, equal to the angle between the parallel portion 9b1 and the inclined descendent portion 9b2, because the second lid 5 can be caused to travel without inclination.

The parallel portion 9a1 of the second front guide groove 9a and the parallel portion 9b1 of the second rear guide groove 9b, when closing the second lid 5 shown in FIG. 1, act to guide the second lid 5 forward to thereby close the opening 2a1.

The inclined descendent portion 9a2 of the second front guide groove 9a and the inclined descendent portion 9b2 of the second rear guide groove 9b, when opening the second lid 5 shown in FIG. 2, act to guide the second lid 5 rearward to thereby open the opening 2a1.

Also, the second cam 9 includes a relief groove 9m (refer to FIG. 10) having a recess shape and serving as clearance for the first front boss 4p1 (refer to FIG. 4) of the first lid 4.

As shown in FIG. 7, due to the provision of the relief groove 9m of the second cam 9, the first front boss 4p1 of the first lid 4 can duly act without interruption.

And, the second cam 9 includes a front guide boss 9c1 and a rear guide boss 9c2 which project outward, and which are set in a second guide groove 10b (refer to FIG. 12) of the lid rail 10, whereby the front and rear direction linear motion is guided.

First Cam 8

Figure 11A:
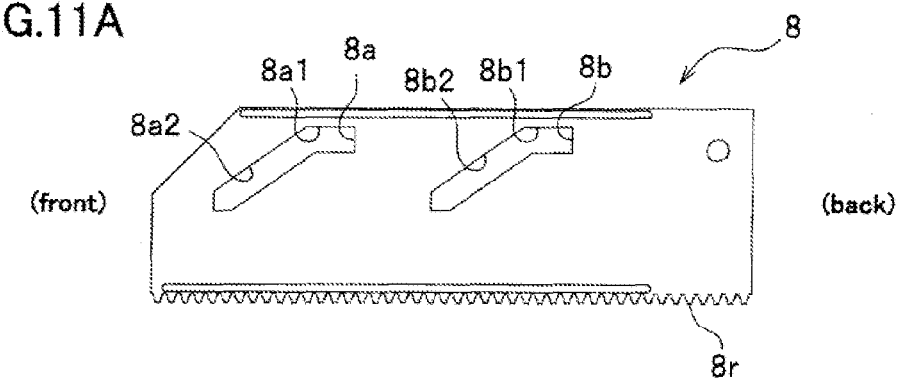
FIG. 11A is a plan view of a first cam seen from inside.
Figure 11B:
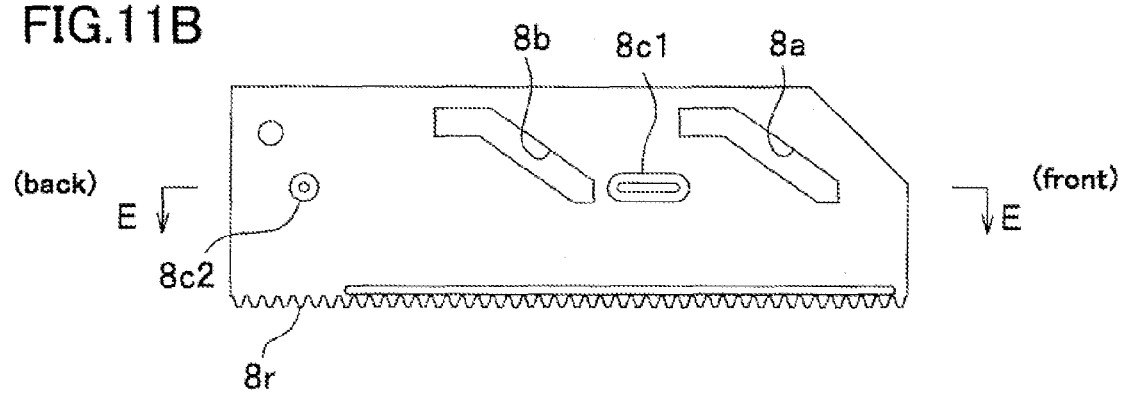
FIG. 11B is a plan view of the first cam seen from outside.
Figure 11C:
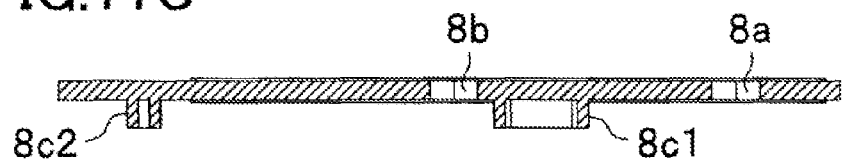
FIG. 11C is a cross sectional view of the first cam taken along a line E-E shown in FIG. 11B.
Figure 11D:
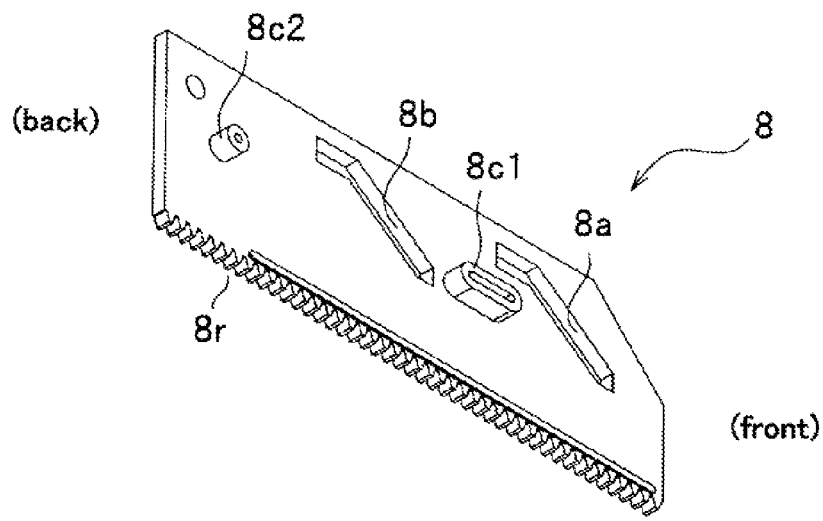
FIG. 11D is a perspective view of the first cam seen from the rear lower side.

FIG. 11A shows the first cam 8 viewed from the inside, FIG. 11B shows the first cam 8 viewed from the outside, FIG. 11C shows a cross section of the first cam 8 taken along a line E-E shown in FIG. 11B, and FIG. 11D perspectively shows the first cam 8 viewed from the rear lower side.

The first cam 8 is a member to perform action of opening and closing the first lid 4 (refer to FIG. 1) and is formed to have a rectangular flat plate shape extending in the front and rear direction.

A rack (cam rack) 8r is formed at a lower end rim of the first cam 8 so as to engage with the pinion 13p from the above which is fixed to each of the both ends of the drive shaft 13 shown FIGS. 8 and 9. The first cam 8 is caused to move in the front and rear direction by the rotation movement of the pinion 13p when the rack 12 shown in FIGS. 8 and 9 moves linearly in the front and rear direction (direction indicated by the arrows α2 and α3 shown in FIG. 7).

The first cam 8 includes a first front guide groove (first cam groove) 8a to guide the front boss 4p (refer to FIG. 4) of the first lid 4, and a first rear guide groove (first cam groove) 8b to guide the first rear boss 4p2 of the first lid 4.

The first front guide groove 8a includes a parallel portion 8a1 formed horizontally, and an inclined descendent portion 8a2 extending continuously from an end of the parallel portion 8a1 so as to inclined downward. An angle made between the parallel portion 8a1 and the inclined descendent portion 8a2 can be arbitrarily determined, for example, 45 degrees.

The first rear guide groove 8b includes a parallel portion 8b1 formed horizontally, and an inclined descendent portion 862 extending continuously from an end of the parallel portion 8b1 so as to inclined downward. An angle made between the parallel portion 8b1 and the inclined descendent portion 8b2 can be arbitrarily determined, for example, 45 degrees.

In this connection, it is more preferable if the angle between the parallel portion 8a1 and the inclined descendent portion 8a2 is set, as shown in FIGS. 11A and 11B, equal to the angle between the parallel portion 8b1 and the inclined descendent portion 8b2, because the first lid 4 can be caused to travel without inclination.

The parallel portion 8a1 of the first front guide groove 8a and the parallel portion 8b1 of the first rear guide groove 8b, when closing the first lid 4 shown in FIG. 1, act to guide the first lid 4 forward to thereby close the opening 2a1.

The inclined descendent portion 8a2 of the first front guide groove 8a and the inclined descendent portion 8b2 of the first rear guide groove 8b, when opening the first lid 4 shown in FIG. 2, act to guide the first lid 4 rearward to thereby open the opening 2a1.

And, the first cam 8 includes a front guide boss 8c1 and a rear guide boss 8c2 which project outward, and which are set in a first guide groove 10a (refer to FIG. 12) of the lid rail 10, whereby the front and rear linear motion is guided.

Lid Rail 10

Figure 12A:
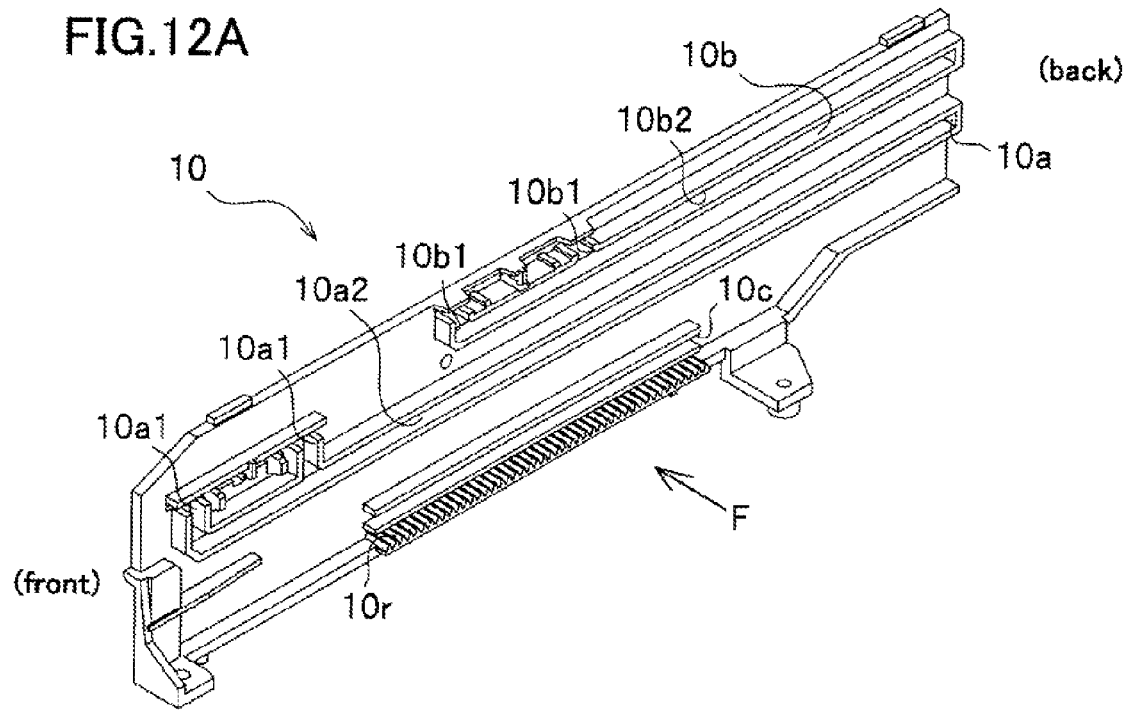
FIG. 12A is a perspective view of a lid rail seen obliquely from the front upper side.
Figure 12B:
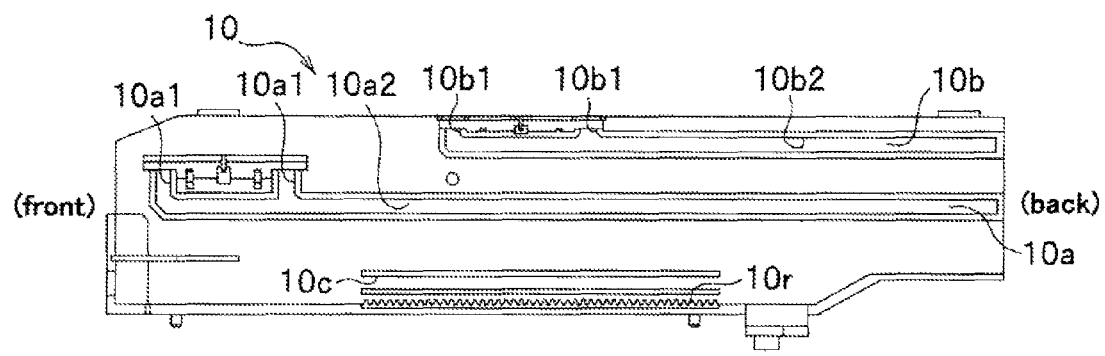
FIG. 12B is a plan view of the lid rail seen from inside in a direction indicated by an arrow F shown in FIG. 12A.
Figure 12C:
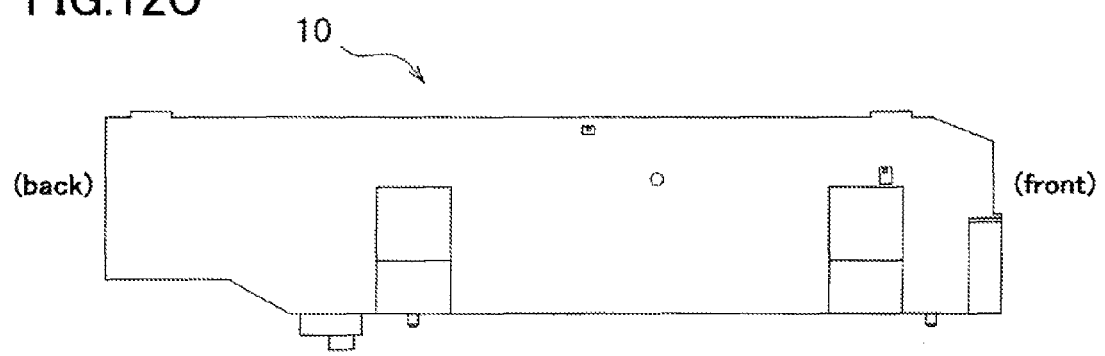
FIG. 12C is a plan view of the lid rail seen from outside.

FIG. 12A perspectively shows an inside of the lid rail 10 viewed obliquely from the front upper side, FIG. 12B shows the lid rail 10 viewed from the inside in a direction indicated by an arrow F shown in FIG. 12A, and FIG. 12C shows the lid rail 10 viewed from the outside.

The lid rail 10 is provided immediately inside each of respective side plates 2t and 3t of the upper and lower cases 2 and 3 and acts to guide the first cam 8 and the second cam 9 in the front and rear direction.

Also, the lid rail 10 guides the first cam 8, the second cam 9, the first lid 4 and the second lid 5 in the front and rear direction, whereby the opening 2a1 can be duly opened and closed by the first lid 4 and the second lid 5 as shown FIGS. 1 and 2.

In the lid rail 10, a first guide groove (first lid rail groove) 10a in which the front boss 4p1 and the first rear boss 4p2 of the first lid 4 shown in FIG. 4 are set and guided, and also in which the front guide boss 8c1 and the rear guide boss 8c2 of the first cam 8 shown in FIG. 11 are set and guided, is formed such that a rib is projected inward.

The first guide groove 10a includes a first vertical guide groove 10a1 to guide the first cam 8 and the first lid 4 upward when closing the first lid 4 shown in FIG. 1, and a first horizontal guide groove 10a2 to guide the first cam 8 and the first lid 4 rearward when opening the first lid 4 shown in FIG. 2.

Also, in the lid rail 10, a second guide groove (second lid rail groove) 10b, in which the second front boss 5p1 and the second rear boss 5p2 of the second lid 5 shown in FIG. 5 are set and guided, and also in which the front guide boss 9c1 and the rear guide boss 9c2 of the second cam 9 shown in FIG. 10 are set and guided, is formed such that a rib is projected inward.

The second guide groove 10b includes a second vertical guide groove 10b1 to guide the second cam 9 and the second lid 5 upward when closing the second lid 5 shown in FIG. 1, and a second horizontal guide groove 10b2 to guide the second cam 9 and the second lid 5 rearward when opening the second lid 5 shown in FIG. 2.

A rack (lid rail rack) 10r which is engaged with the pinion 13p fixed to each of the both ends of the drive shaft 13 below the lid rail 10 is formed at the lower portion of the lid rail 10. Immediately above the rack 10r, a drive shaft guide groove 10c, which has a linear shape, and in which an end portion 13a (refer to FIGS. 8 and 9) of the drive shaft 13 having the pinion 13p fixed thereto is set and guided in the front and rear direction, is formed such that a rib is projected in an inward direction.

Action of the Pinion 13p of the Drive Shaft 13, the Second Cam 9 and the First Cam 8

The end portion 13a of the drive shaft 13 is rotatably and slidably set in the drive shaft guide groove 10c provided at each of the both right and left lid rails 10. And, the pinion 13p fixed to the drive shaft 13 is engaged with the rack 10r of the lid rail 10 and therefore rotates on the rack 10r of the lid rail 10, when the rack 12 moves in the front and rear direction (direction indicated by the arrows α1 and α2 shown in FIGS. 8 and 9).

Since a shaft insertion through-hole 9s, in which the drive shaft 13 is rotatably inserted, is formed at each of the both right and left second cams 9 (refer to FIG. 10), the second cam 9 is caused to move in the front and rear direction at the same speed as the rack 12.

The second front boss 5p1 and the second rear boss 5p2 are set respectively in the second front guide groove 9a and the second rear guide groove 9b of the second cam 9 and make contact in the front and read direction, whereby the second lid 5 is caused to move in the front and read direction.

Meanwhile, since the rack 8r of the first cam 8 is engaged with the pinion 13p at an upper location of the pinion 13p, the both right and left first cams 8 (refer to FIG. 11) are caused to move in the front and second direction at a speed same as a circumferential speed of the pinion 13p.

The first front boss 4p1 and the first rear boss 4p2 are set respectively in the first front guide groove 8a and the first rear guide groove 8b of the first cam 8 and make contact in the front and rear direction, whereby the first lid 4 is caused to move in the front and rear direction.

Since a ratio of a front and rear travel direction distance of a center (drive shaft 13, rack 12) of the pinion 13p to a circumferential travel distance of the pinion 13p correspond to a ratio of a radius of the pinion 13p to a diameter of the pinion 13p, the circumferential travel distance of the pinion 13p is equal to twice the front and rear direction travel distance of the center (rack 12) of the pinion 13p.

Accordingly, the right and left first cams 8 move in the front and rear direction at a speed equal to twice a speed of the right and left second cams 9, and therefore the first lid 4 moves in the front and second direction at a speed equal to twice a speed of the second lid 5.

From a position where the opening 2a1 is closed by the first lid 4 and the second lid 5 as shown in FIG. 1 to a position where the opening 2a1 is opened by the first lid 4 and the second lid 5 as shown in FIG. 2, the first lid 4 travels for a distance equal to substantially twice a travel distance of the second lid 5, but since the first lid 4 moves at a speed equal to substantially twice a speed of the second lid 5, the first lid 4 and the second lid 5 reach the position shown in FIG. 2 almost at the same time.

In this connection, since the first cam 8 and the second cam 9 are regulated from moving in the up and down direction respectively by the first guide groove 10a and the second guide groove 10b provided in the lid rail 10, an engagement between the pinion 13p and the first cam 8 is maintained.

Detection of the opening and closing of the opening 2a1

Description will now be made of detection of the opening and closing of the opening 2a1. As described above, the opening and closing of the opening 2a1 is carried out by the first lid 4 and the second lid 5.

Figure 13A:
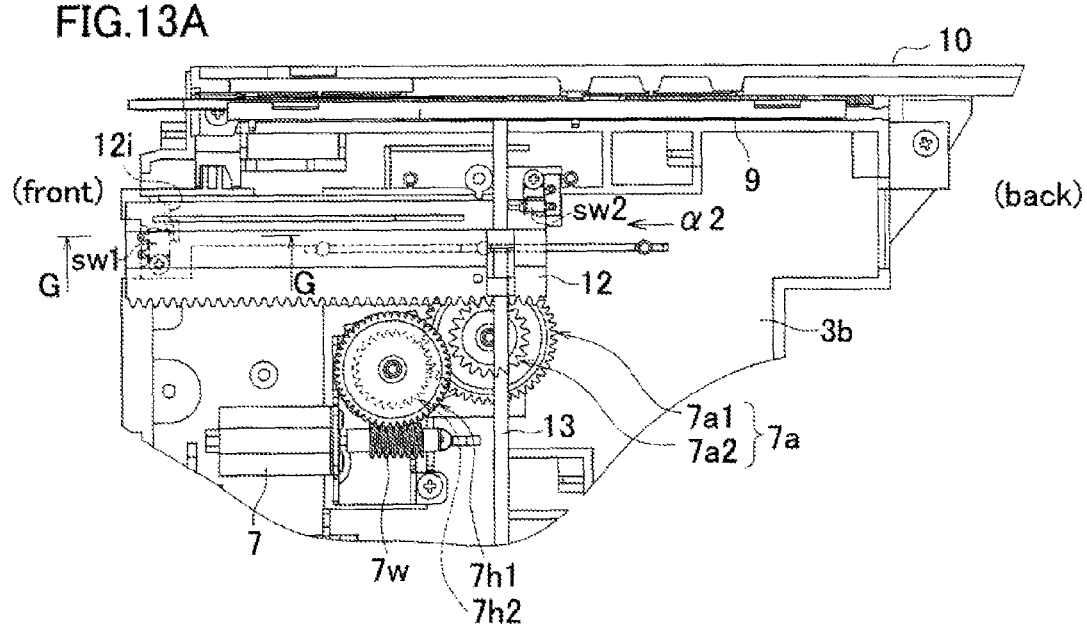
FIG. 13A is a plan view of a portion located near a rack seen from the upper side, wherein a position of the rack is shown when the opening is closed by the first lid and the second lid.
Figure 13B:
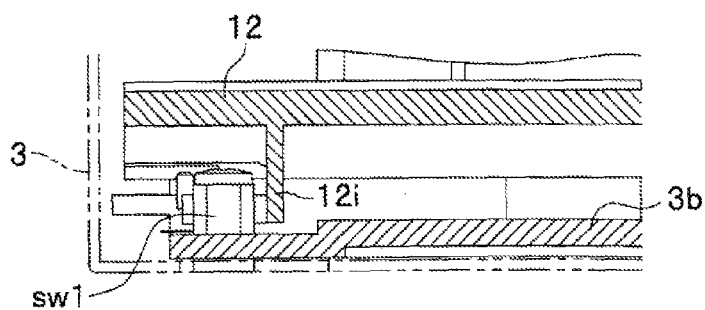
FIG. 13B is an enlarged cross sectional view of a portion of FIG. 13A taken along a line G-G shown in FIG. 13A.

When the opening 2a1 is closed by the first lid 4 and the second lid 5 as shown in FIG. 1, the rack 12 is located at a position shown in FIG. 13A. FIG. 13A shows the rack 12 and a relevant portion therearound viewed from the upper side, wherein a position of the rack 12 is shown when the opening 2a1 is closed by the first lid 4 and the second lid 5, and FIG. 13B shows, in an enlarged manner, a cross section of a portion in FIG. 13A taken along G-G shown in FIG. 13A.

A position detection rib 12i (refer to FIG. 13B) to indicate the position of the rack 12 when the opening 2a1 is closed or opened by the first lid 4 and the second lid 5 is provided at a front lower portion of the rack 12 so as to project downward. On the other hand, a front position detection sensor sw1 to sense that the opening 2a1 is closed by the first lid 4 and the second lid 5 is provided on the base 3b.

When the position detection rib 12i makes contact with the front position detection sensor sw1 provided on the base 3b, it is detected that the opening 2a1 is closed by the first lid 4 and the second lid 5.

It is configured such that the rack 12 travels a little further in a front direction (direction indicated by an arrow α2 shown in FIG. 13A) after the opening 2a1 is closed by the first lid 4 and the second lid 5, whereby the position detection rib 12i makes contact with the front position detection sensor sw1. Consequently, the variation of dimension error and assembly error of relevant members, such as the first lid 4, the first cam 8, the second lid 5, the second cam 9 or the like can be absorbed, and the opening 2a1 can be reliably closed.

Figure 14:
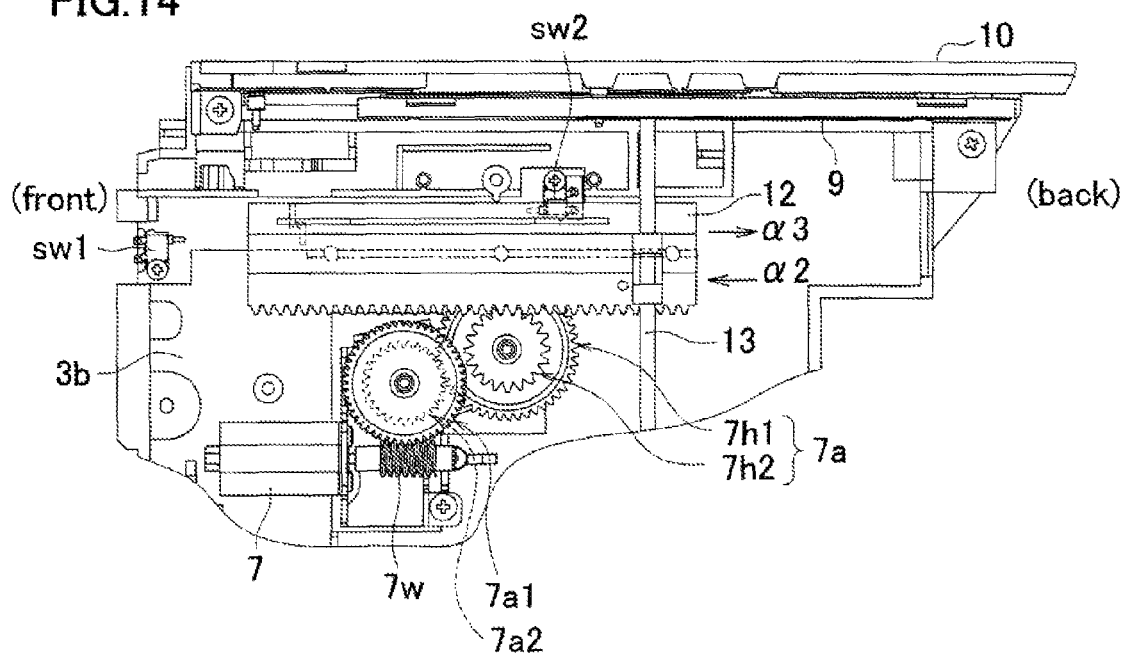
FIG. 14 is a plan view of the portion near the rack seen from the upper side, while the opening is opened or closed by the first lid and the second lid.

FIG. 14 shows, in plan, the rack 12 and the relevant portion therearound viewed from the upper side when the opening 2a1 is being opened or closed by the first lid 4 and the second lid 5.

When the opening 2a1 is being opened by the first lid 4 and the second lid 5, the rack 12 is moved rearward by the first motor 7 as shown by an arrow α3 shown in FIG. 14. Meanwhile, when the opening 2a1 opened is being closed by the first lid 4 and the second lid 5, the rack 12 is moved forward by the rotary drive of the first motor 7 as indicated by an arrow α2 shown in FIG. 14.

Figure 15A:
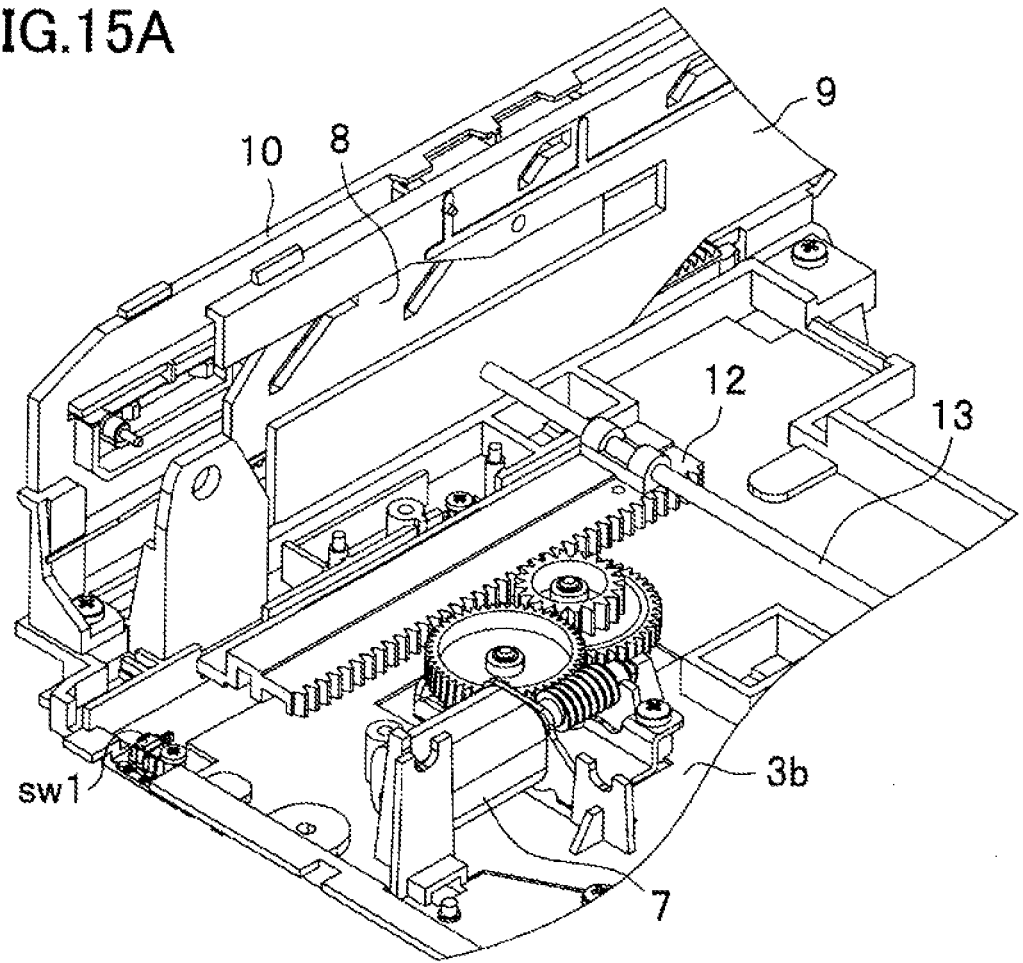
FIG. 15A is a perspective view of the portion near the rack seen obliquely from the front upper side, while the opening is opened or closed by the first lid and the second lid.
Figure 15B:
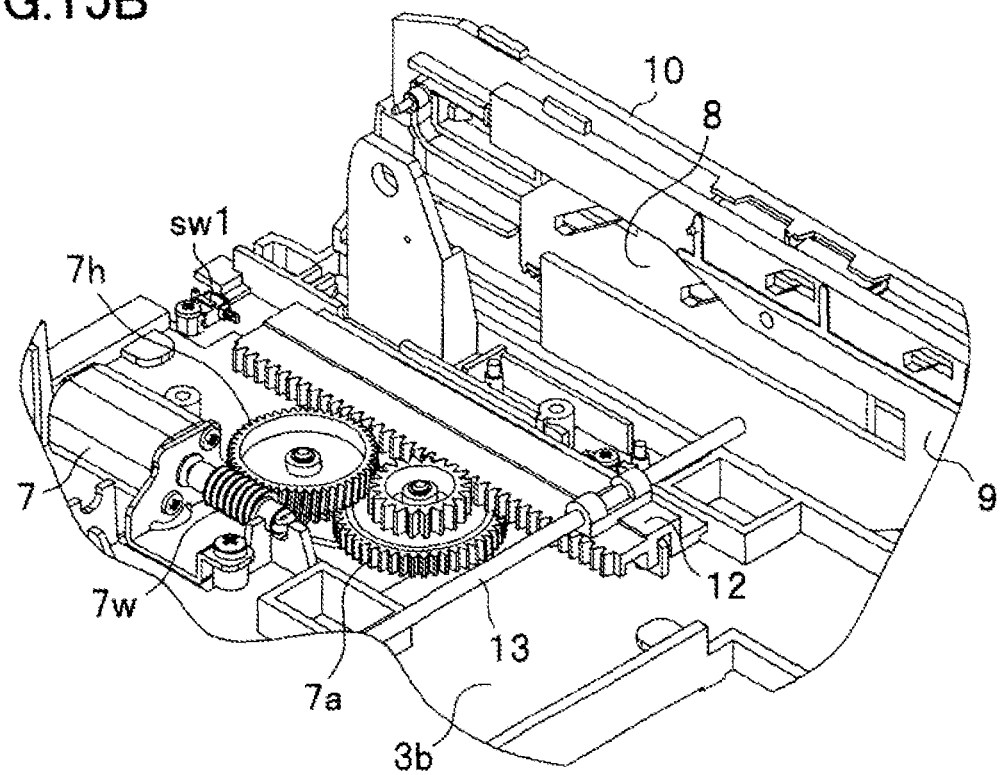
FIG. 15B is a perspective view of the portion near the rack seen obliquely from the rear upper side, while the opening is opened or closed by the first lid and the second lid.

FIG. 15A perspectively shows the rack 12 and the relevant portion therearound viewed obliquely from the front upper side when the opening 2a1 is being opened or closed by the first lid 4 and the second lid 5, and FIG. 15B perspectively shows the rack 12 and the relevant portion therearound viewed obliquely from the rear upper side when the opening 2a1 is being opened or closed by the first lid 4 and the second lid 5.

Figure 16A:
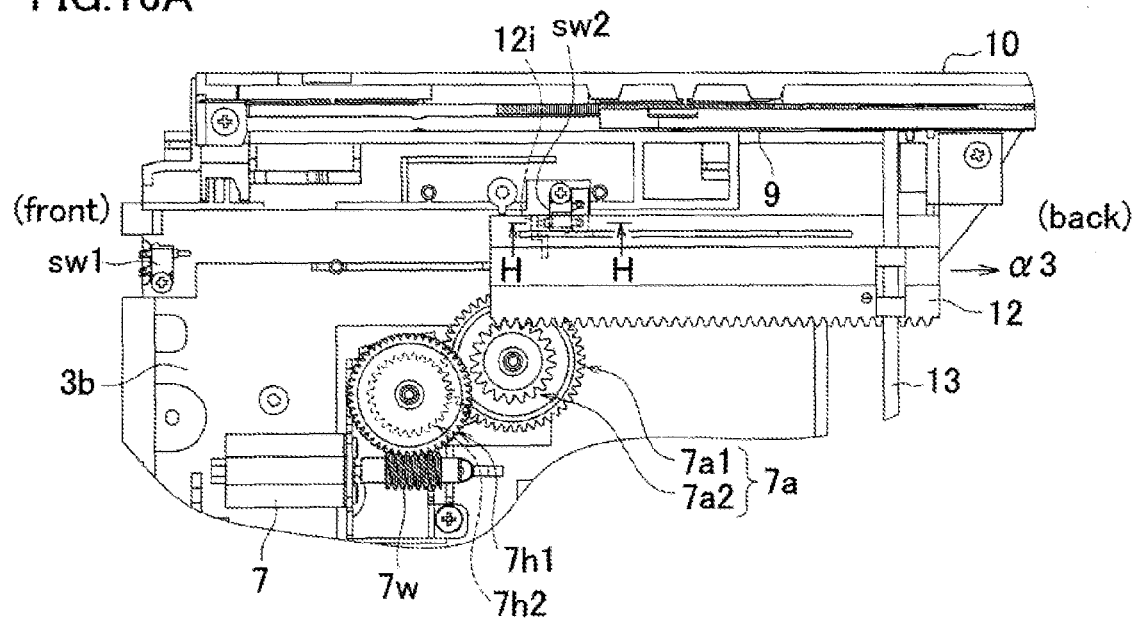
FIG. 16A is a plan view of the portion near the rack seen from the upper side, showing a position of the rack when the opening is opened by the first lid and the second lid.
Figure 16B:
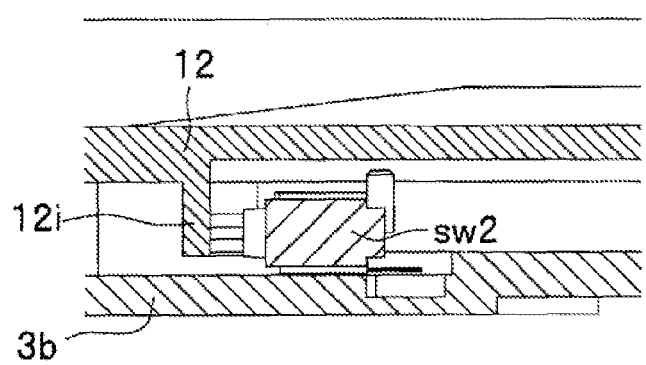
FIG. 16B is an enlarged cross sectional view of a portion of FIG. 16A taken along a line H-H shown in FIG. 16A.

FIG. 16A shows, in plan, a position of the rack 12 viewed from the upper side when the opening 2a1 is opened by the first lid 4 and the second lid 5, and FIG. 16B shows, in an enlarged manner, a cross section of a portion of FIG. 16A taken along a line H-H shown in FIG. 16A.

A rear position detection sensor sw2 to sense that the first lid 4 and the second lid 5 are opened is provided on the base 3b.

When the rack 12 moves rearward so that the opening 2a1 is opened by the first lid 4 and the second lid 5 and so that the first lid 4 and the second lid 5 are retracted in a rear portion 2a2 of the upper surface plate 2a of the upper case 2 as shown in FIG. 1, the position detection rib 12i makes contact with the rear position detection sensor sw2 provided on the base 3b as shown in FIG. 16, whereby it is sensed that the opening 2a1 is opened by the first lid 4 and the second lid 5.

In this case described above, it is configured such that the rack 12 travels a little further in a rear direction (direction indicated by an arrow α3 shown in FIG. 13A) after the opening 2a1 is opened by the first lid 4 and the second lid 5, whereby the position detection rib 12i makes contact with the rear position detection sensor sw2. Consequently, the variation of dimension error and assembly error of relevant members, such as the first lid 4, the first cam 8, the second lid 5, the second cam 9 or the like can be absorbed, and the opening 2a1 can be reliably opened.

Opening and Closing Structure of the Combiner 6

Description will now be made of an opening and closing structure of the combiner 6 shown in FIGS. 2 and 3.

Figure 17:
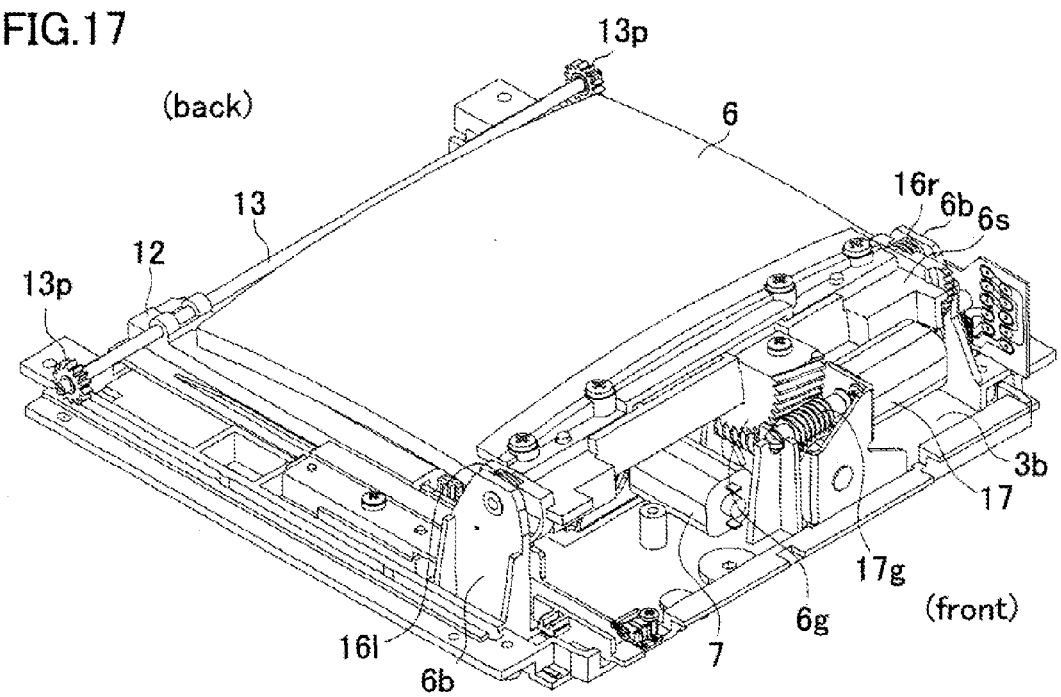
FIG. 17 is a perspective view of an internal structure of the display device, when the display device is not in use such that the combiner is retracted.

FIG. 17 perspectively shows an inside structure of the display device 1 viewed obliquely from the front upper side when the display device 1 is not in use such that the combiner 6 is retracted.

A second motor (second drive source) 17 to raise up and retract the combiner 6 is fixedly attached at a front portion of the base 3b of the display device 1. A second motor gear 17g is fixedly attached to a shaft of the second motor 17.

A helical gear 6a is attached to a combiner support 6s by which the combiner 6 is supported. The helical gear 6g of the combiner support 6s is engaged with the second motor gear 17g of the second motor 17, whereby when the second motor 17 is driven, the drive force is conveyed to the combiner 6 via the second motor gear 17g and the helical gear 6g, and the combiner 6 is raised up and retracted.

In the configuration described above, the combiner 6s is fixed to the combiner support 6s, and the combiner support 6s is rotatably attached to a combiner bracket 6b attached to the base 3b fixed to the lower case 3.

Figure 18:
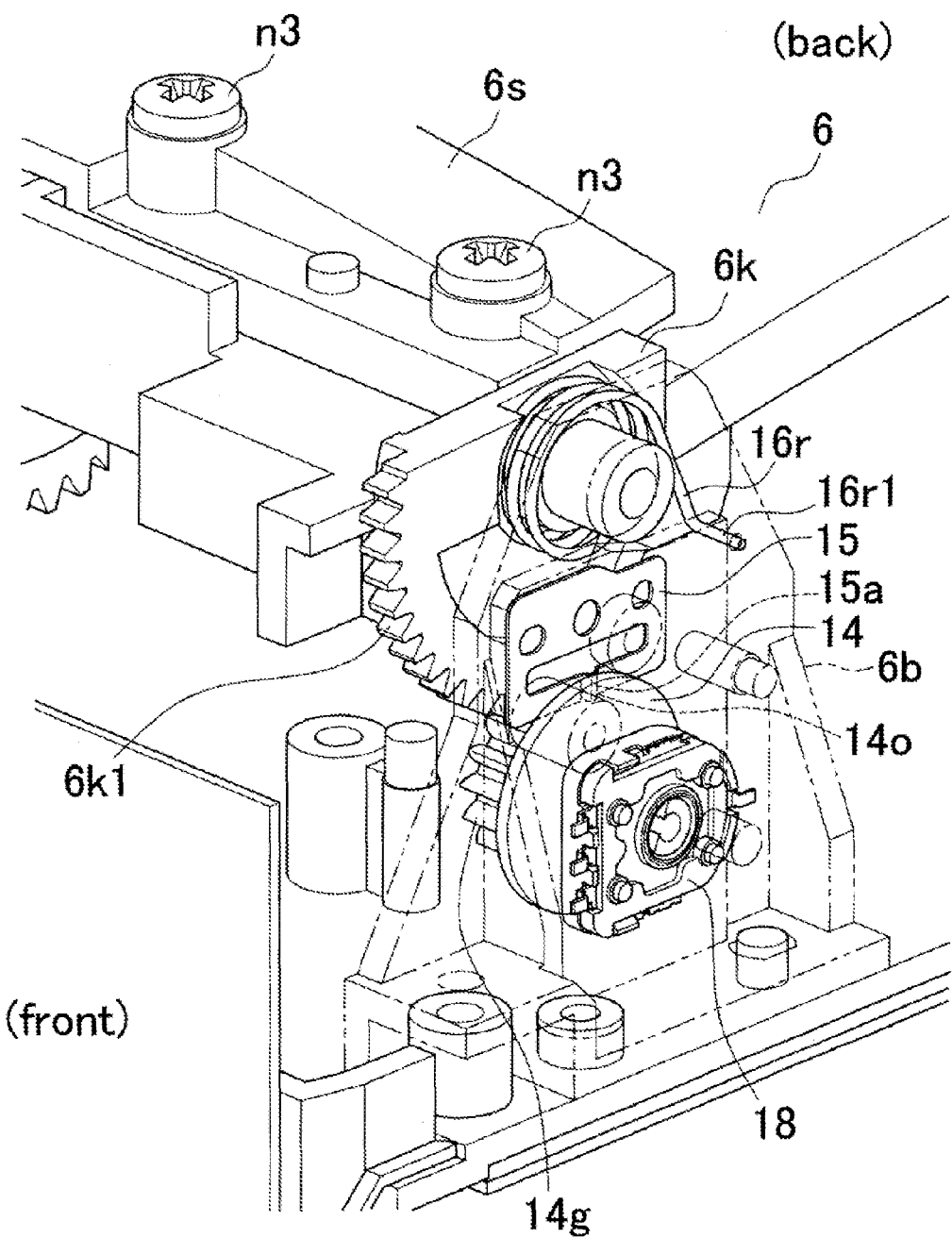
FIG. 18 is a perspective view of a support portion of the combiner seen obliquely from the front upper side.

FIG. 18 perspectively shows a support portion of the combiner 6 viewed obliquely from the front upper side.

An angle sensor 18 to detect a condition of the combiner 6 raised up is provided at the support portion of the combiner 6. A rotary circular plate 14 having an angle detection gear 14g is rotatably supported at the combiner bracket 6b so as to oppose the angle sensor 18. The angle sensor 18 detects a rotation angle of the rotary circular plate 14 to thereby detect the rise-up condition of the combiner 6.

An angle detection gear member 6k including a partial gear 6k1 is fixed to the combiner support 6s to which the combiner 6 shown in FIG. 18 is fixed by pan head small screws n3.

The partial gear 6k1 of the angle detection gear member 6k is constantly engaged with the angle detection gear 14g of the rotary circular plate 14. A shaft of the rotary circular plate 14 is inserted through a rotation detection hole of the angle sensor 18, and the shaft of the rotary circular plate 14 and a rotation detection structure of the angle sensor 18 rotate together without rattling.

When the combiner 6 is not in use (retracted), the angle sensor 18 must be set to show an initial angle. In order to verify an initial position at a time of assembly, a boss 15a of a plate spring 15 is inserted in a notch 14o formed at the rotary circular plate 14. Thus, a point of origin for angle detection can be secured.

With the configuration described above, when the combiner 6 is gradually raised up by the drive of the second motor 17 from the retracted condition shown in FIG. 18, the angle detection gear 14g of the rotary circular plate 14 is rotated by the partial gear 6k1 of the angle detection gear member 6k of the combiner support 6s, and the rotation angle of the rotary circular plate 14 is detected by the angle sensor 18, whereby the rise-up condition of the combiner 6 is detected.

Contrariwise, when the combiner 6 is retracted from the rise-up condition, the rotary circular plate 14 is rotated by an engagement between the partial gear 6k1 of the angle detection gear member 6k of the combiner support 6s and the angle detection gear 14g of the rotary circular plate 14, whereby the boss 15a of the plate spring 15 is fitted in the notch 14o formed at the rotary circular plate 14. At this time, the angle sensor 18 is set to the initial position, the second motor 17 stops, and the combiner 6 is set in non-use condition (retracted).

Figure 19B:
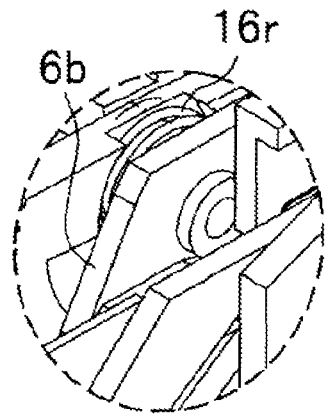
FIG. 19B is an enlarged view of an area indicated by a circle I shown in FIG. 19A.
Figure 19C:
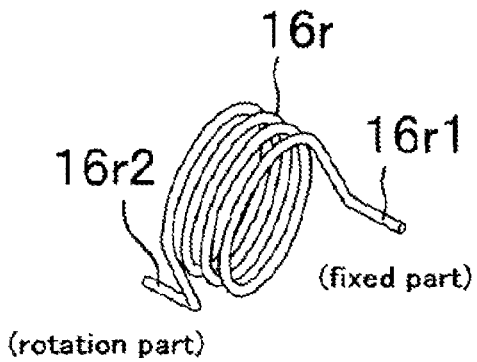
FIG. 19C is a perspective view of a right torsion coil spring, when the combiner is retracted.

FIG. 19A perspectively shows a support structure of the combiner 6 viewed obliquely from the front upper side, when the combiner 6 is retracted to be stored. FIG. 19B shows, in an enlarged manner, a circled portion indicated by I shown in FIG. 19A, FIG. 19C perspectively shows a right torsion coil spring 16r viewed when the combiner 6 is retracted, and FIG. 19D perspectively shows the right torsion coil spring 16r viewed when the combiner 6 is raised up.

Figure 19D:
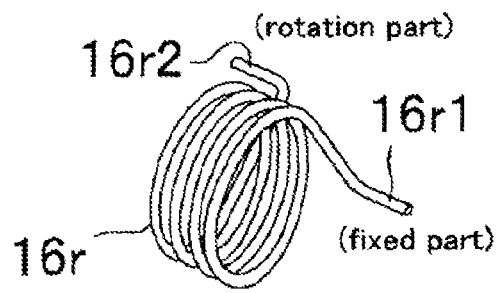
FIG. 19D is a perspective view of the right torsion coil spring, when the combiner is raised up.
Figure 19E:
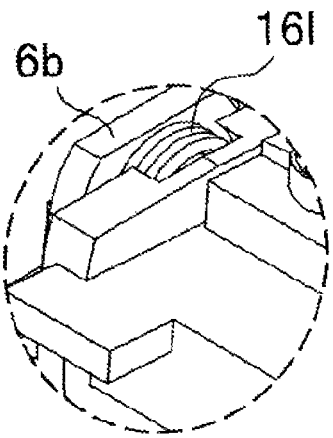
FIG. 19E is an enlarged view of an area indicated by a circle J shown in FIG. 19A.
Figure 19F:
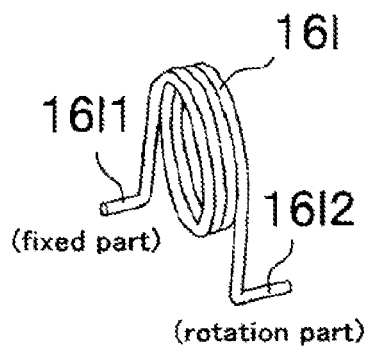
FIG. 19F is a perspective view of a left torsion coil spring, when the combiner is retracted.
Figure 19G:
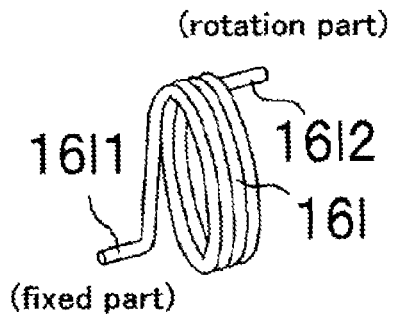
FIG. 19G is a perspective view of the left torsion coil spring, when the combiner is raised up.

FIG. 19E shows, in an enlarged manner, a circled portion indicated by J in FIG. 19A, FIG. 19F perspectively shows a left torsion coil spring 16l viewed when the combiner 6 is retracted, and FIG. 19G perspectively shows the left torsion coil spring 16l viewed when the combiner 6 is raised up.

The right and left torsion coil springs (biasing means) 16r and 16l are provided respectively at both right and left sides in a symmetric manner.

One end 16r1 (refer to FIG. 19C) of the right torsion coil spring 16r is engaged with a right combiner bracket 6b fixed to the base 3b, and the other end 16r2 (refer to FIG. 19C) of the right torsion coil spring 16r is engaged with the combiner support 6s to which the combiner 6 is fixed.

When the combiner 6 is raised up, since the other end 16r2 of the right torsion coil spring 16r is rotated by the combiner support 6s as shown in FIG. 19D, the right torsion coil spring 16r is provided with elasticity, and an elastic force is generated to act in such a direction as to cause the combiner 6 to be retracted.

One end 16l1 (refer to FIG. 19F) of the left torsion coil spring 16l is engaged with a left combiner bracket 6b fixed to the base 3b, and the other end 16l2 (refer to FIG. 19F) of the left torsion coil spring 16l is engaged with the combiner support 6s to which the combiner 6 is fixed.

When the combiner 6 is raised up, since the other end 16l2 of the left torsion coil spring 16l is rotated by the combiner support 6s as shown in FIG. 19G, the right torsion coil spring 16l is provided with elasticity, and an elastic force is generated to act in such a direction as to cause the combiner 6 to be retracted.

Figure 20:
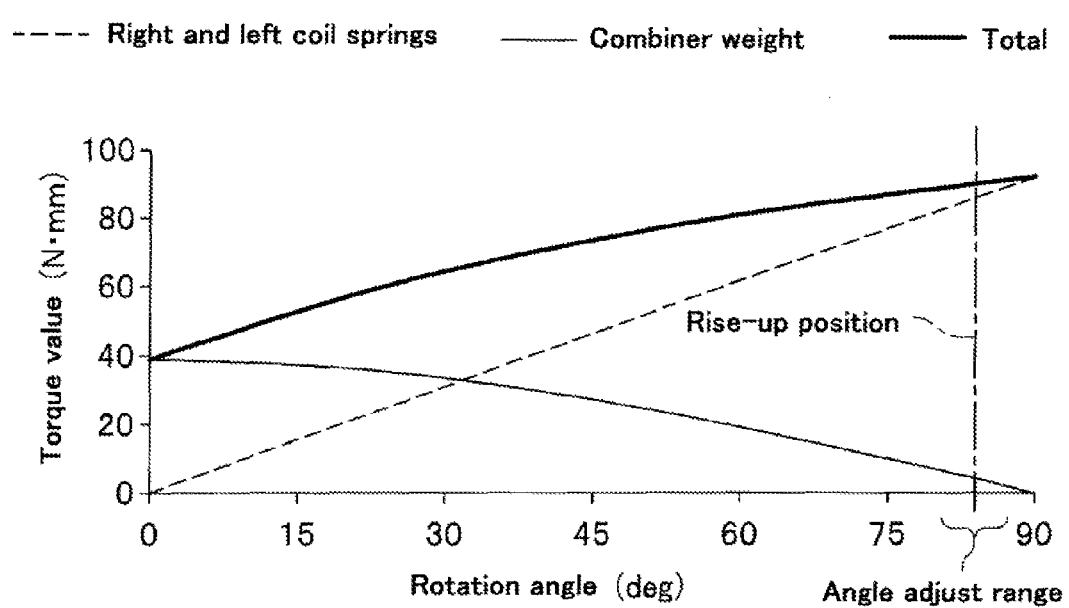
FIG. 20 is a graph of a torque value in a direction of retraction of the combiner relative to a rotation angle of the combiner.

FIG. 20 represents a graph of a torque value in a direction of retraction of the combiner 6 in relation to a rotation angle of the combiner 6. The horizontal axis indicates the rotation angle (deg), and the vertical axis indicates the torque value (N·mm) in the direction of retraction of the combiner 6.

Since the horizontal distance between the rotation center of the combiner 6 and the gravity center of the combiner 6 becomes shorter in accordance with an increase in the rotation angle of the combiner 6, the torque value (thin solid line shown in FIG. 20) generated due to the weight of the combiner 6 in the direction of the retraction of the combiner 6 decreases.

In accordance with an increase in the rotation angle of the combiner 6, the torque value (broken line shown in FIG. 20) generated due to the elasticity of the right and left torsion coil springs 16r and 16l in the direction of the retraction of the combiner 6 increases in accordance with an increase in the elasticity of the right and left torsion coil springs 16r and 16l resulting from an increase of the torsion displacement of the right and left torsion coil springs 16r and 16l. The right and left torsion coil springs 16r and 16l apply a given amount of elastic force in the direction of retraction of the combiner 6 raised up.

An aggregate amount of torque value (thick solid line shown in FIG. 20) increases with an increase of the rotation angle, wherein the torque value is defined as combination between the torque value generated due to the weight of the combiner 6 in the direction of the retraction of the combiner 6 and the torque value generated due to the elasticity of the right and left torsion coil springs 16r and 16l in the direction of the retraction of the combiner 6.

Consequently, a torque is applied in the direction of retraction at a position of the combiner 6 raised up (around at a rotation angle of 90 degrees in FIG. 20).

As a result, the helical gear 6g of the combiner support 6s can surely make contact with the second gear 17g of the second motor 17, whereby the combiner 6 raised up can be suppressed from vibrating due to disturbance.

And, it is configured such that the elastic force acting on the combiner 6 becomes reduced while the combiner 6 becomes retracted, and gets to "0" when the combiner is completely retracted.

In this connection, if a prescribed torque value is applied to the combiner 6 raised up, it may be configured such that the elastic force acting on the combiner 6 gets to a value different from "0" when the combiner 6 is completely retracted, unlike as shown in FIG. 20.

Opening and Closing Action of the Opening 2a1 by Means of the First Lid 4 and the Second Lid 5, and Rising Up Action of the Combiner 6

Description will now be made of the opening and closing action of the opening 2a1 by means of the first lid 4 and the second lid 5, and the rising up action of the combiner 6.

Opening and Closing Action of the Opening 2a1 by Means of the First Lid 4 and the Second Lid 5

FIGS. 21A, 22A, 23A, 24A and 25A, in combination, schematically show an action of the first cam 8, the second cam 9 and the pinion 13p while the first lid 4 and the second lid 5 which are closed are being opened, and FIGS. 21B, 22B, 23B, 24B and 25B schematically show respective positions of the first lid 4 and the second lid 5 shown in FIGS. 21A, 22A, 23A, 24A and 25A.

As described above, the opening and closing action of the opening 2a1 by means of the first lid 4 and the second lid 5 is performed by the rack 12 traveling in the front and rear direction (direction indicated by the arrows α2 and α3 shown in FIG. 7). That is to say, in the case when the opening 2a1 is closed by the first lid 4 and the second lid 5 as shown in FIG. 1, the rack 12 travels in the front direction (direction indicated by the arrow α2 shown in FIG. 7), and in the case when the opening 2a1 is opened by the first lid 4 and the second lid 5 as shown in FIG. 2, the rack 12 travels in the rear direction (direction indicated by the arrow α3 shown in FIG. 7).

The first front boss 4p1 and first rear boss 4p2 of the first lid 4 are set in the first front guide groove 8a and the first rear guide groove 8b of the first cam 8, and also in the first guide groove 10a of the lid rail 10.

The second front boss 5p1 and second rear boss 5p2 of the second lid 5 are set in the second front guide groove 9a and the second rear guide groove 9b of the second cam 9, and also in the second guide groove 10b of the lid rail 10.

Figure 21A:
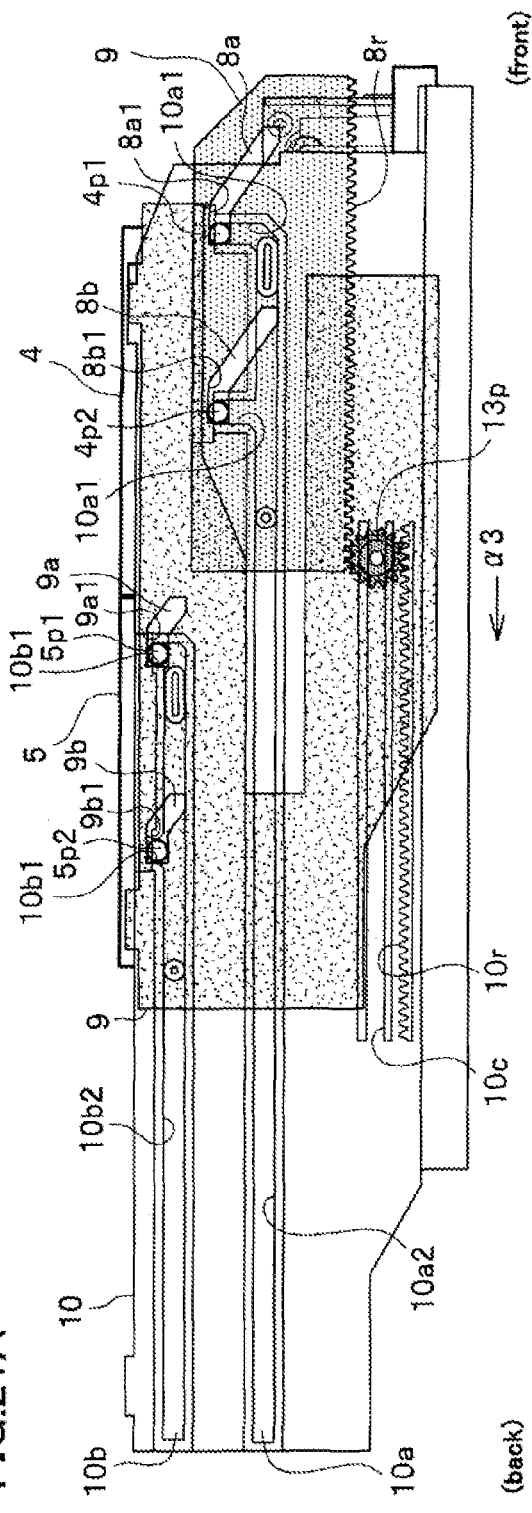
FIG. 21A is a schematic side view of an operation of the first and second cams and a pinion, when the opening closed by the first lid and the second lid is being opened.
Figure 21B:
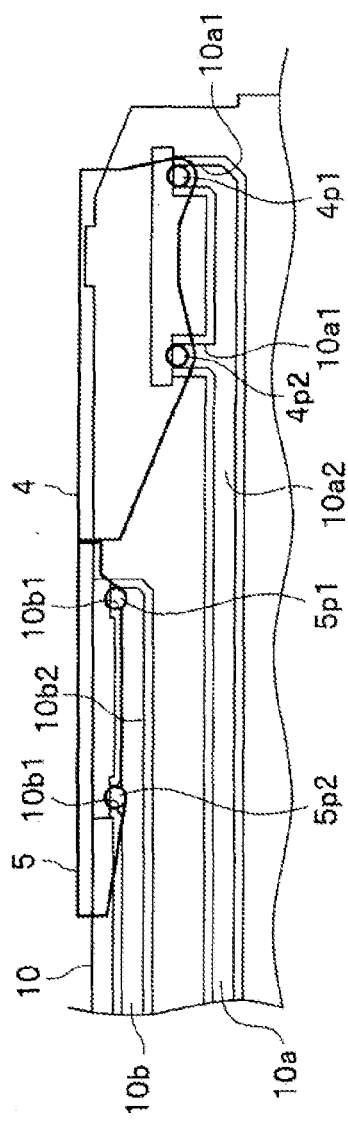
FIG. 21B is a schematic side view of position of the first lid and the second lid at the operation of FIG. 21A.

When the opening 2a1 shown in FIG. 1 is closed by the first lid 4 and the second lid 5, the condition is as shown in FIGS. 21A and 21B. At the start of traveling, the first front boss 4p1 and the first rear boss 4p2 of the first lid 4 are set in the first vertical guide groove 10a1 oriented substantially vertical to the first guide groove 10a of the lid rail 10, and the second front boss 5p1 and the second rear boss 5p2 of the second lid 5 are set in the second vertical guide groove 10b1 oriented substantially vertical to the second guide groove 10b of the lid rail 10.

In the configuration described above, in order to prevent the first lid 4 and the second lid 5 from interfering with each other when traveling horizontally, the vertical travel distance of the first lid 4, that is, the length of the first vertical guide groove 10a1 is set larger than the length of the second vertical guide groove 10b1.

When the first motor 7 is driven in order to open the opening 2a1, the rack 12 travels in the rear direction (direction indicated by the arrow α3 shown in FIG. 7), and thereby the pinion 3p is caused to travel in the rear direction (direction indicated by an arrow α3 shown in FIG. 21A), whereby the first cam 8 and the second cam 9 are caused move in the rear direction as shown in FIG. 21A.

Figure 22A:
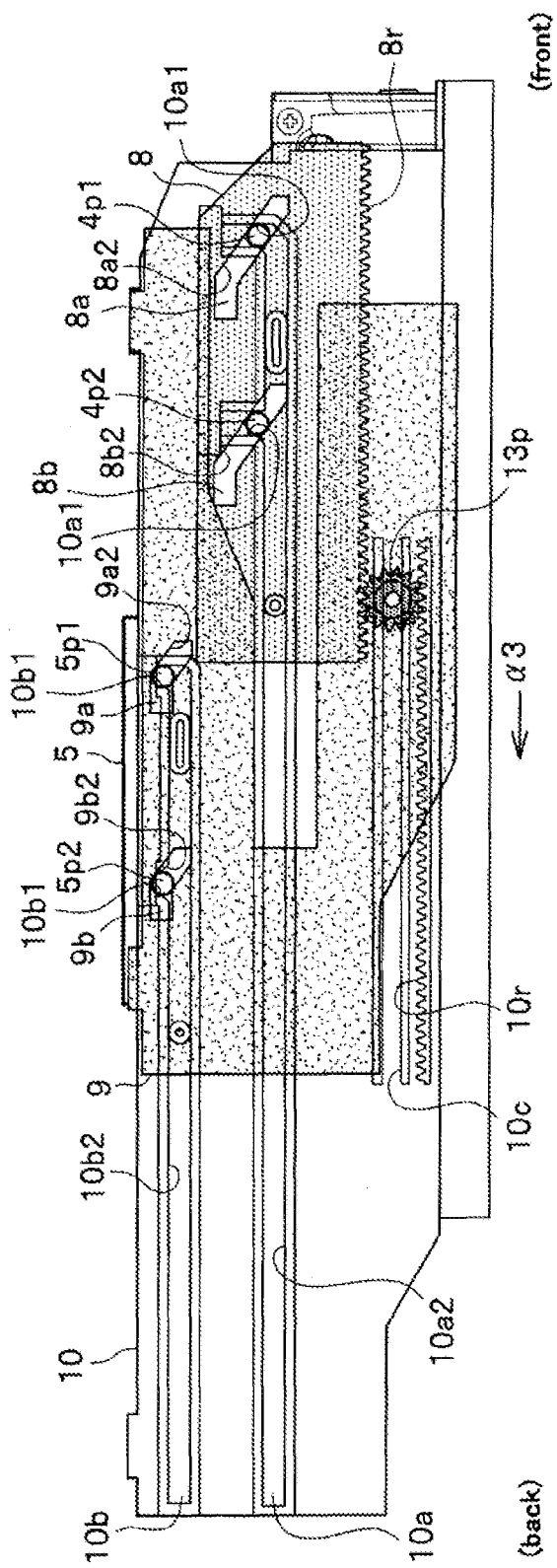
FIG. 22A is a schematic side view of an operation of the first and second cams and the pinion, when the opening closed by the first lid and the second lid is being opened.
Figure 22B:
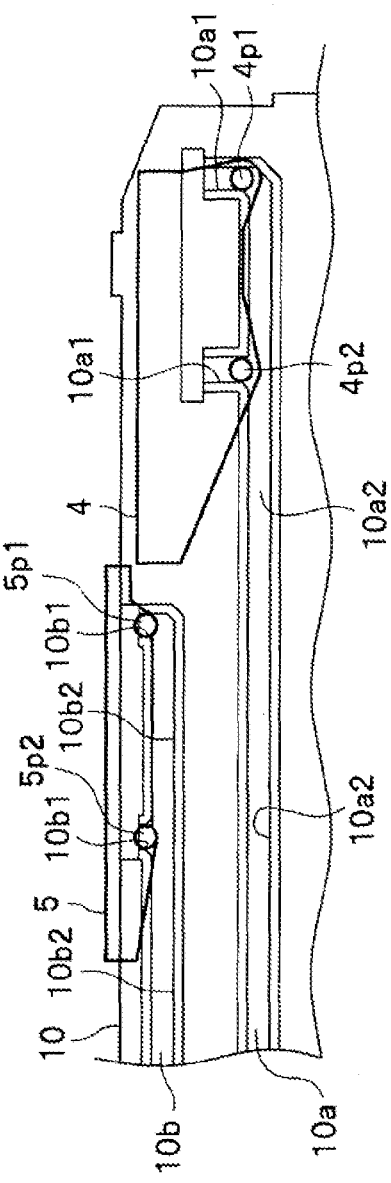
FIG. 22B is a schematic side view of position of the first lid and the second lid at the operation of FIG. 22A.

The first front boss 4p1 and the first rear boss 4p2 of the first lid 4 are engaged respectively with the inclined descendent portion 8a2 and the inclined descendent portion 8b2 of the first cam 8 as shown in FIG. 22A and forced downward, and also are set in the first vertical guide groove 10a1 oriented substantially vertical to the first guide groove 10a of the lid rail 10, whereby the first lid 4 descends substantially vertically while maintaining its horizontal leveling.

Similarly, the second front boss 5p1 and the second rear boss 5p2 of the second lid 5 are engaged respectively with the inclined descendent portion 9a2 and the inclined descendent portion 9b2 of the second cam 9 and forced downward, and also are set in the second vertical guide groove 10b1 oriented substantially vertical to the second guide groove 10b of the lid rail 10, whereby the second lid 5 descends substantially vertically while maintaining its horizontal leveling.

Then, the first front boss 4p1 and the first rear boss 4p2 of the first lid 4 are set respectively in the inclined descendent portion 8a2 and the inclined descendent portion 8b2 of the first rear guide groove 8b of the first cam 8 as shown in FIG. 23A and forced rearward in the travel direction of the first cam 8, and also are set in the first parallel guide groove 10a2 oriented substantially horizontal to the first guide groove 10a of the lid rail 10, whereby the first lid 4 travels rearward.

Also, the second front boss 5p1 and the second rear boss 5p2 of the second lid 5 are engaged respectively with the inclined descendent portion 9a2 of the second front guide groove 9a and inclined descendent portion 9b2 of the second rear guide groove 9b of the second cam 9 and forced rearward in the travel direction of the second cam 9, and also are set in the second parallel guide groove 10b2 oriented substantially horizontal to the second guide groove 10b of the lid rail 10, whereby the second lid 5 travels rearward.

Figures 25A, 25B:
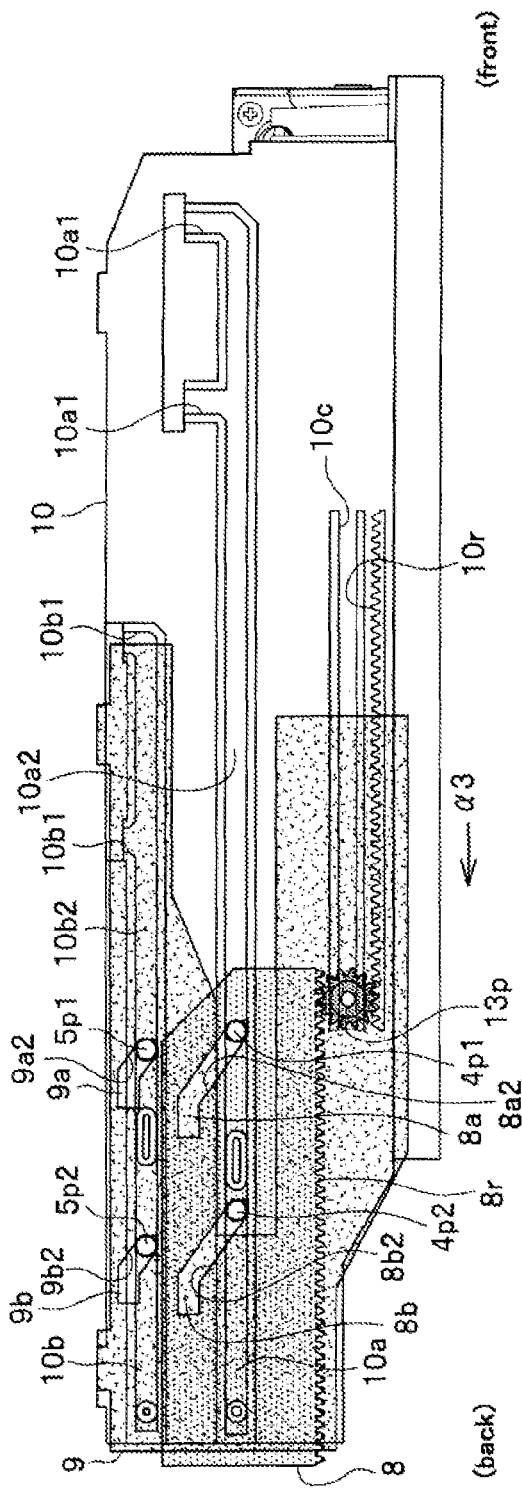
FIG. 25A is a schematic side view of an operation of the first and second cams and the pinion, when the opening closed by the first lid and the second lid is being opened.
FIG. 25B is a schematic side view of position of the first lid and the second lid at the operation of FIG. 25A.

Then, when the first cam 8 and the second cam 9 travel further rearward as shown in FIG. 24A, and the first lid 4 and the second lid 5 travel rearward so as to reach a position for storage as shown in FIG. 25A, the position detection rib 12i of the rack 12 makes contact with the rear position detection sensor sw2 (refer to FIG. 16), whereby it is detected that the first lid 4 and the second lid 5 are stored and the opening action of the first lid 4 and the second lid 5 is completed.

Rising Up Action of the Combiner 6

As described above, the opening 2a1 of the upper case 2 is opened, and then the rising up action of the combiner 6 is to be performed.

When the second motor 17 starts rotation based on the detection of the opening action by the rear position detection sensor sw2, the power of the second motor 17 is conveyed via the second motor gear 17g to the helical gear 6g attached to the combiner support 6s shown in FIG. 17.

When the power of the second motor 17 is conveyed to the helical gear 6g, the combiner 6 is caused to rise up in such a manner that the combiner 6 rotates about the axis of a fulcrum of the combiner bracket 6b. When the combiner 6 rotates up to a predetermined angle (standard position) as shown in FIGS. 8 and 9, the rotation angle (standard position) is detected by the angle sensor 18 (refer to FIG. 18) and the rising up action is completed.

An image projected on the combiner 6 by a light source provided in the upper and lower cases 2 and 3 is located at different places depending on an observing point of a user, for example a driver, and therefore the rising up position of the combiner 6 must be adjusted by the user. So, it is configured such that the user is enabled to adjust the rising up position of the combiner 6 by rotating the second motor 17 in the normal direction or the reverse direction by an operation button (not shown) while the combiner 6 is raised up.

When the combiner 6 is retracted for storage, an action reversed to the action described above is performed.

Specifically, the combiner 6 is retracted and stored in the upper and lower cases 2 and 3 by rotating the second motor 17 in the reverse direction, then position detection is conducted by the angle sensor 18, and the motion of the second motor 17 is finished. Then, the rack 12 is moved by the rotation drive of the first motor 7 from the condition shown in FIG. 7 in a direction indicated by the arrow α2.

With the action described above, the first lid 4 and the second lid 5 are transferred from the condition shown in FIG. 25A to the condition shown in FIG. 21A thus moved forward, whereby the position detection rib 12i of the rack 12 makes contact with the front position detection sensor sw1 (refer to FIG. 13), which detects the completion of the action thereby stopping the action of the first motor 7, and the opening 2a1 of the upper case 2 is closed by the first lid 4 and the second lid 5.

When the opening 2a1 is closed by the first lid 4 and the second lid 5, the first lid 4 and the second lid 5 are biased downward by a plate spring (not shown). For example, a plate spring, which has its center portion positioned downward so as to have a substantially wing shape, is provided above each of the first lid 4 and the second lid 5 which are closed. The substantially wing shaped plate spring is adapted to press downward each of the first lid 4 and the second lid 5 which are closed.

With the configuration described above, the first lid 4 and the second lid 5 are suppressed from vibrating thus suppressing abnormal noises, such as resonance, which are attributable to vibration, whereby a use, for example a driver is prevented from feeling discomfort.

Also, when the first lid 4 and the second lid 5 are retracted for storage as shown in FIG. 3, the first lid 4 and the second lid 5 are biased in the front direction (direction indicated by an arrow γ1 shown in FIG. 7) by the plate spring 2b (refer to FIG. 7) thereby preventing generation of abnormal noises attributable to vibration.

As described above, also when the combiner 6 is raised up, in order to prevent disturbance of images on the combiner 6 due to the vibration and impact of the combiner 6, the combiner 6 is fixed and thereby prevented from vibrating in such a manner that the combiner support 6s is biased by the right and left torsion coil springs 16r and 16l (refer to FIG. 19) to ensure that the helical gear 6g makes contact with the second motor gear 17g.

With the configuration described above, the following effects can be obtained:

1. Since the lid to cover the opening 2a1 is divided into two sections, specifically the first lid 4 and the second lid 5, the dimension of the rack 12 to move the cover can be reduced.

2. Since the cover is divided into two sections, the first lid 4 and the second lid 5 which are folded up for storage, the entire depth of the display device 1 can be reduced thus enabling downsizing of the device.

3. Since the cover is divided and the opening and closing action is performed by sliding the divided cover, the range of cover motion is not required thus enabling downsizing of the entire display device 1.

4. Since the first lid 4 moves at a travel speed equal to twice the speed of the second lid 5, the action times of the first lid 4 and the second lid 5 can be reduced. Also, the first lid 4 and the second lid 5 can move smoothly for the opening and closing action.

5. Since the first lid 4 moves at a travel speed equal to twice the speed of the second lid 5, the actions times of the first lid 4 and the second lid 5 can be equivalent to each other.

6. Since the first lid 4 moves at a travel speed equal to twice the speed of the second lid 5, the retraction times of the first lid 4 and the second lid 5 can be equivalent to each other, and the appearance of the retraction action is enhanced thus improving the level of visibility, which enhances the commodity value.

7. Since the first lid 4 and the second lid 5 are moved at the same time by respective different component members, the load can be distributed and so reduced, whereby the first lid 4 and the second lid 5 can act smoothly.

8. When the opening 2a1 is covered by the first lid 4 and the second lid 5, the upper surfaces of the upper case 2, the first lid 4 and the second lid 5 can be flush with one another thus enhancing the design quality Second Embodiment A second embodiment of the present invention will be described. In the second embodiment, a cover is divided into three sections.

Figure 26:
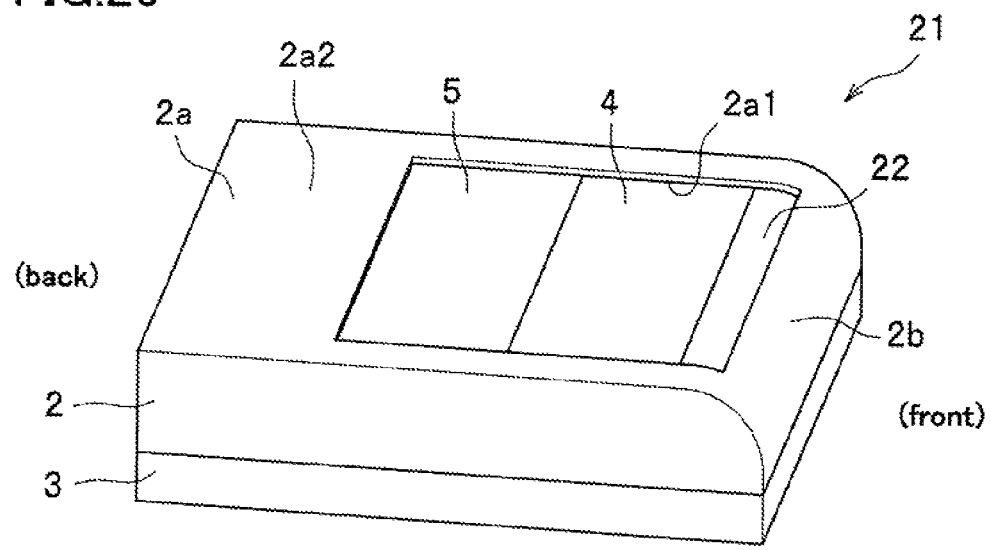
FIG. 26 is a perspective view of a display device according to a second embodiment of the present invention, seen obliquely from the front upper side, wherein the display is not in use.

FIG. 26 perspectively shows a display device 21 according to the second embodiment viewed obliquely from a front upper side, wherein the display device 21 is not in use.

Figure 27:
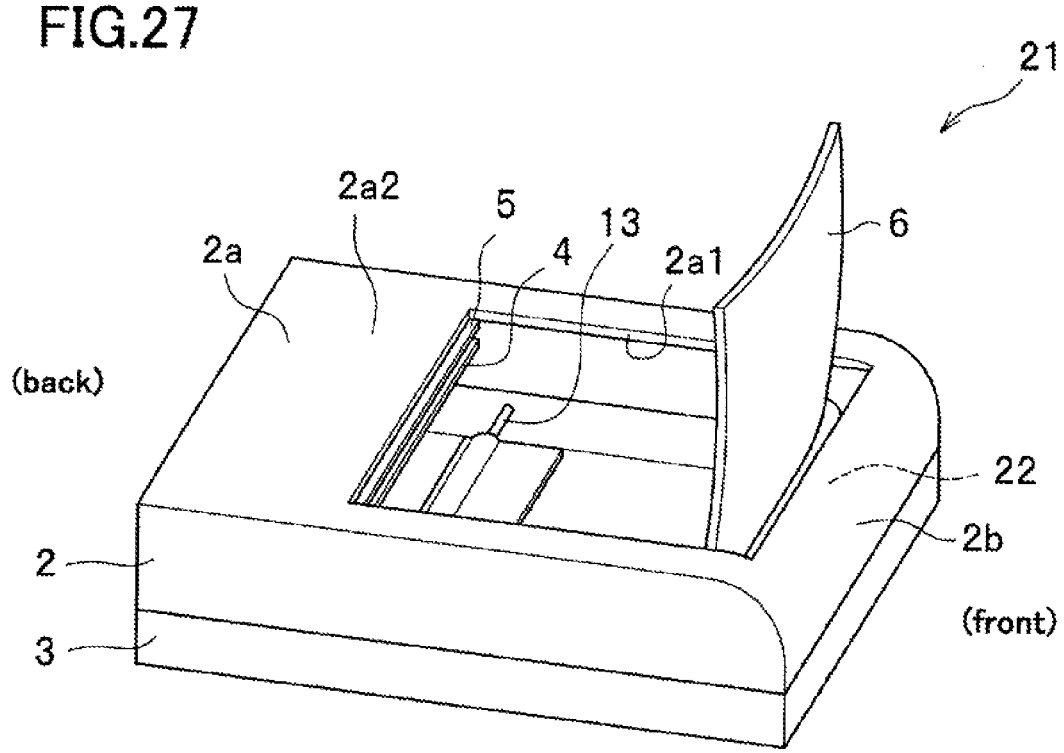
FIG. 27 is a perspective view of the display device of FIG. 26 seen obliquely from the front upper side, wherein a combiner is raised up.

FIG. 27 perspectively the display device 21 viewed obliquely from the front upper side, wherein the display device 21 is in use such that a combiner 6 raised up.

In the display device 21, an opening 2a1 is closed by a cover divided into three sections, that is, a first lid 4, a second lid 5 and a third lid (rotary lid member) 22.

The display device 21 according to the second embodiment is configured the same as the display device 1 according to the first embodiment except that since a part of the opening 2a1 is covered by the third lid 22, the first lid 4 and the second lid 5 are dimensioned smaller, wherein component members having the same or similar configuration are denoted with the same reference numerals and therefore a detailed description thereof will be omitted.

When the combiner 6 is not in use, the opening 2a1 of the display device 21 is closed by the first lid 4, the second lid 5 and the third lid 22 as shown in FIG. 26.

When the combiner 6 is in use, the first lid 4 and the second lid 5 are retracted to be stored below a rear portion 2a2 of an upper surface plate 2a of an upper case 2 as shown in FIG. 27, in the same way as in the first embodiment.

The third lid 22 is rotated to be stored in a front portion 2b of the upper case 2.

Figure 28A:
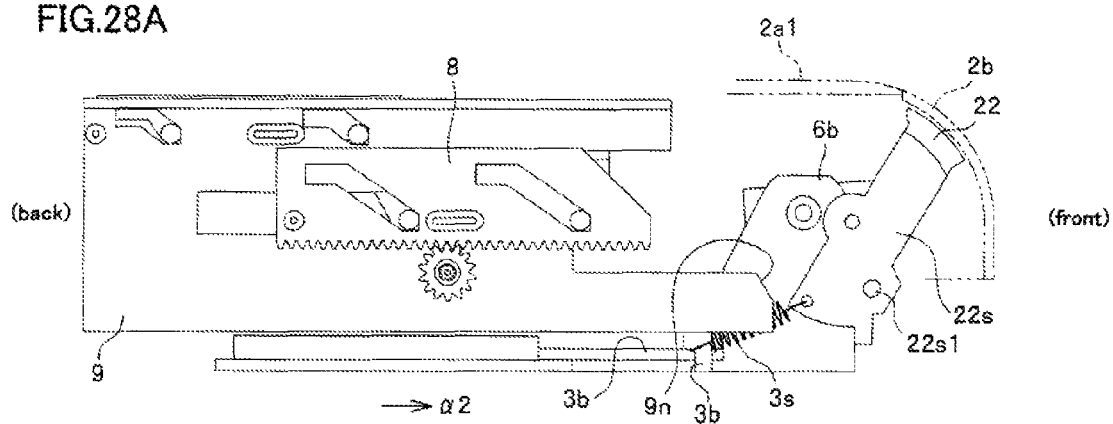
FIG. 28A is a side view of an inside of the display device of FIG. 26, when an opening is opened.
Figure 28B:
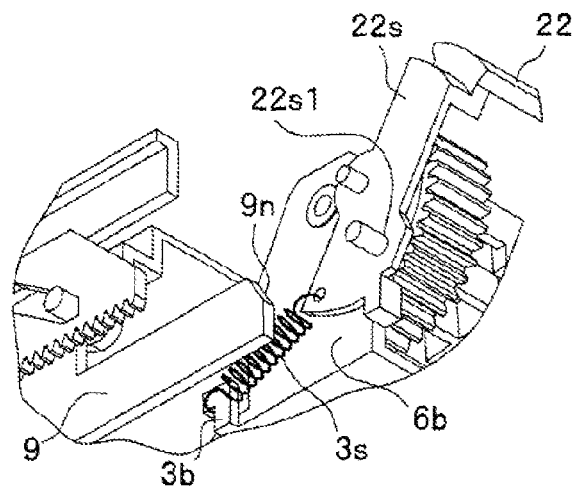
FIG. 28B is a perspective view of the inside of the display device of FIG. 26 seen obliquely from the front lower side, when the opening is opened.

FIG. 28A shows an inner side of the display device 21 viewed when the opening 2a1 is opened, and FIG. 28B perspectively shows an inside of the display device 21 viewed obliquely from a front lower side, when the opening 2a1 is opened.

Figure 29A:
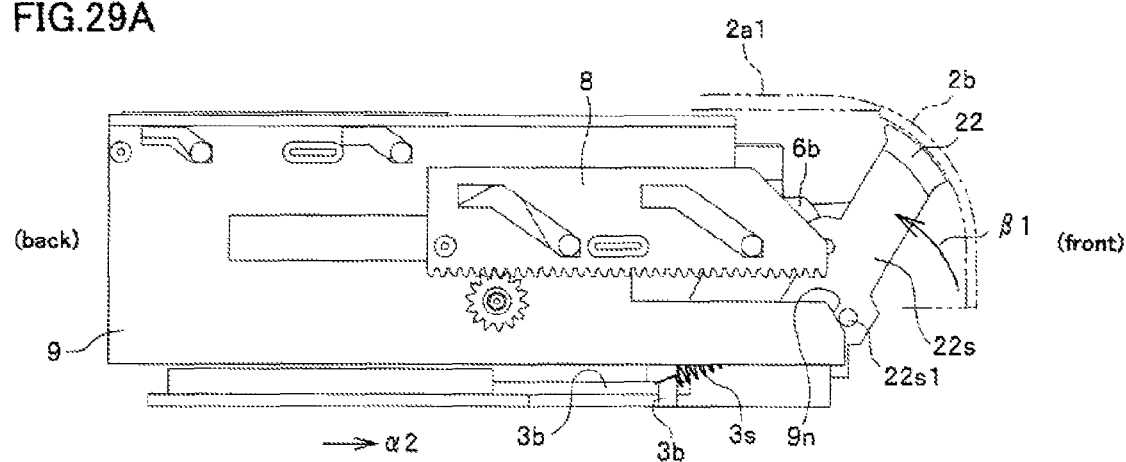
FIG. 29A is a side view of the inside of the display device of FIG. 26, when the opening is being closed.
Figure 29B:
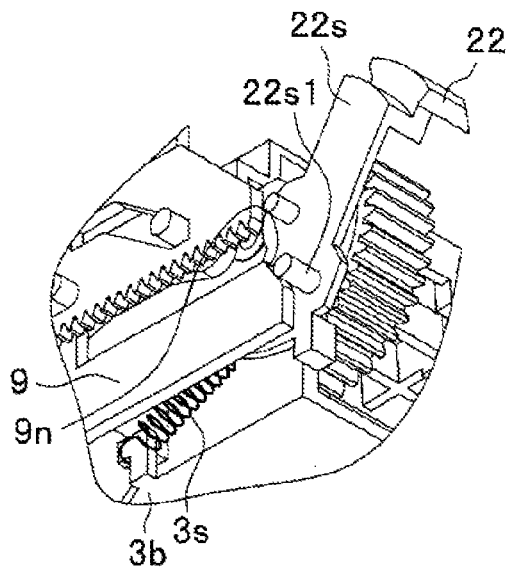
FIG. 29B is a perspective view of the display device of FIG. 26 seen obliquely from the front lower side, when the opening is being closed.

FIG. 29A shows an inner side of the display device 21 viewed when the opening 2a1 is being closed, and FIG. 29B perspectively shows the inside of the display device 21 viewed obliquely from the front lower side, when the opening 2a1 is being closed.

Figure 30A:
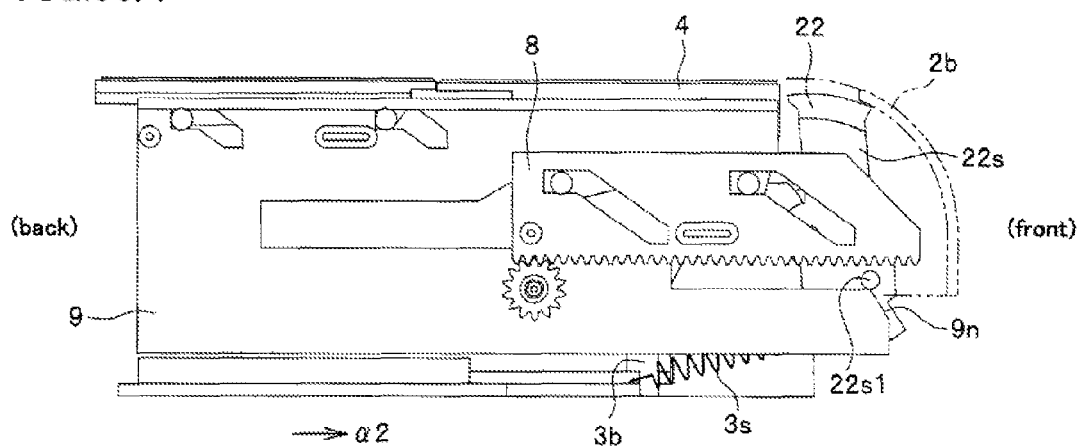
FIG. 30A is a side view of the inside of the display device of FIG. 26, when the opening is closed.
Figure 30B:
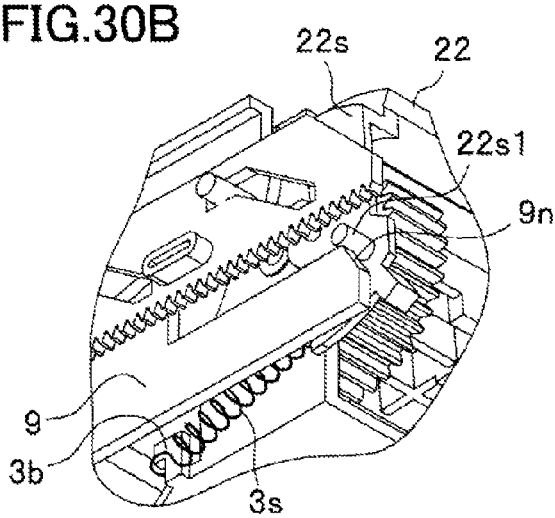
FIG. 30B is a perspective view of the inside of the display of FIG. 26 seen obliquely from the front lower side, when the opening is closed.

FIG. 30A shows the inner side of the display device 21 viewed when the opening 2a1 is closed, and FIG. 30B perspectively shows the inside of the display device 21 viewed obliquely from the front lower side, when the opening 2a1 is closed.

A support member 22s to which the third lid 22 is fixed is rotatably supported at a combiner bracket 6b fixed to a base 3b.

The support member 22s includes a drive boss (rotation opening and closing means) 22s1 projecting outward. The support member 22s is engaged with the other end of a tension coil spring (elastic member) 3s whose one end is engaged with a base 3b, whereby the support member 22s is biased in a direction in which the third lid 22 is opened.

With the configuration described above, when the combiner 6 is in use as shown in FIG. 27, the support member 22s is biased by the tension coil spring 3s, whereby the third lid 22 is opened as shown in FIG. 28.

And, when the combiner 6 becomes out of use, a first cam 8 and a second cam 9 move forward as indicated by an arrow α2 shown in FIG. 29A. At this time, an inclined portion (rotation opening and closing means, closing action portion) 9n formed at a front corner of a second cam 9 pushes up the drive boss 22s1 of the support member 22s upward, whereby the support member 22s rotates rearward, and the third lid 22 rotates rearward (direction indicated by an arrow β1 shown in FIG. 29A).

And, when the opening 2a1 of the upper case 2 is closed by the first lid 4, the second lid 5 and the third lid 22, a position detection rib 12i of a rack 12 makes contact with a front position detection sensor sw1 (refer to FIG. 13) thus detecting the completion of the action, whereby a first motor 7 stops operation, and the first cam 8 and the second cam 9 stop the forward travel action. And, the second cam 9 is stopped from pressing against the drive boss 22s1 of the support member 22s, and the condition becomes as shown in FIG. 30. As a result, the opening 2a1 of the display device 21 is closed by the first lid 4, the second lid 5 and the third lid 22 as shown in FIG. 26.

The opening 2a1 of the display device 21 is opened in a way opposite to the way described above, specifically in the order from FIG. 30A/B through FIG. 28A/B.

According to the second embodiment, since the cover is composed of three lids, the first lid 4 and the second lid 5 have a smaller depth dimension than the first and second lids 4 and 5 in the first embodiment, and therefore the depth dimension of the entire display device 21 can be reduced. Consequently, the display device 21 can be further downsized.

Also, since the opening and closing of the third lid 22 is performed by rotation movement, the operation is more stable compared to parallel movement. And, the operation space is smaller, which contributes to downsizing of the display device 21.

Further, since the opening 2a1 of the display device 21 is closed by the first lid 4, the second lid 5 and the third lid 22, the degree of design freedom, such as dimension, can be increased.

Third Embodiment

A third embodiment of the present invention will be described. In a display device 31 according to the third embodiment, a first lid 4 is retracted immediately below an upper surface plate 2a of an upper case 2, and a second lid 5 is retracted below the first lid 4. Except the configuration described above, the third embodiment has the same configuration as the first embodiment.

Figure 31:
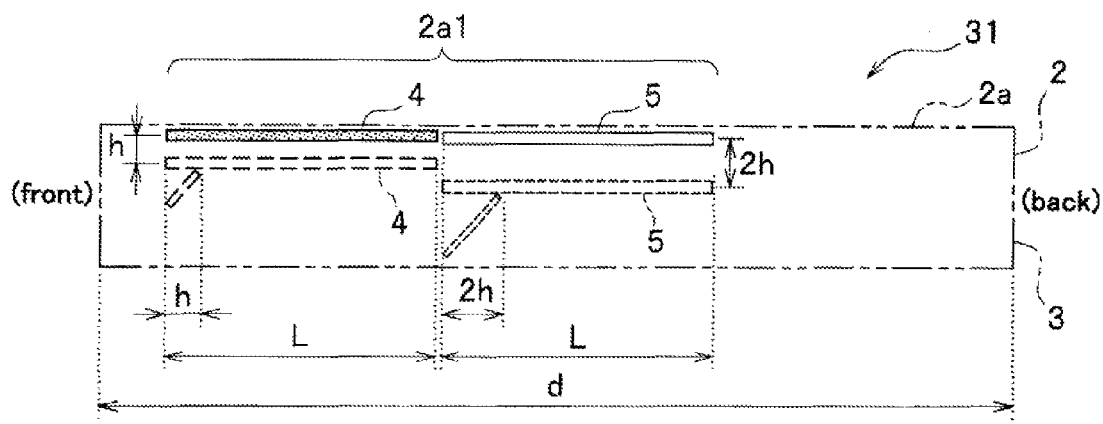
FIG. 31 is a schematic side view of a display device according to a third embodiment of the present invention, when an opening is closed by a first lid and a second lid.

FIG. 31 schematically shows the display device 31 according to the third embodiment viewed from a side, when an opening 2a1 is closed by the first lid 4 and the second lid 5.

Figure 32:
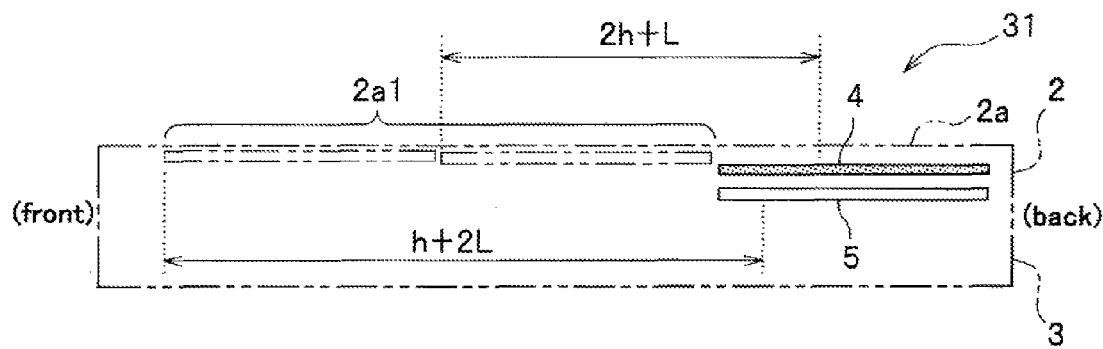
FIG. 32 is a schematic side view of the display device of FIG. 31 seen from a side, when the opening is opened and the first lid and the second lid are retracted inside an upper case.

FIG. 32 schematically shows the display device 31 viewed from the side, when the opening 2a1 is opened such that the first lid 4 and the second lid 5 are retracted in the upper case 2.

Figure 33A:
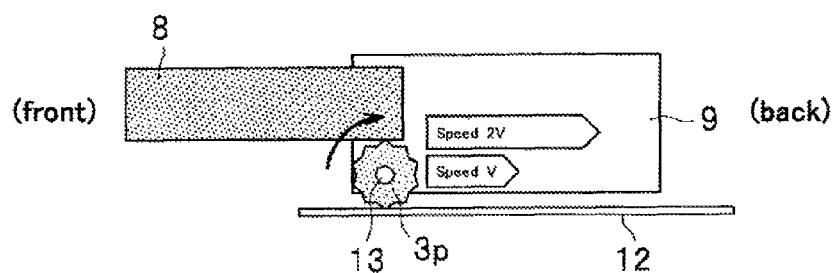
FIG. 33A is a schematic view of relation between traveling speed of a first cam and traveling speed of a second cam, when the opening is being closed by the first lid and the second lid.
Figure 33B:
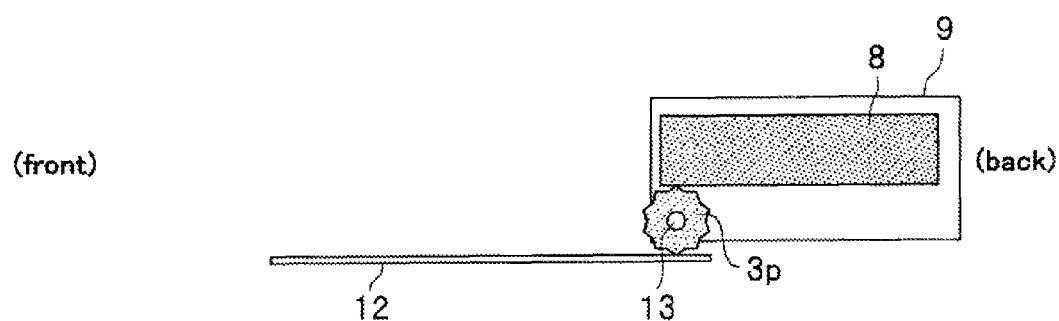
FIG. 33B is a schematic view of relation between traveling speed of the first cam and traveling speed of the second cam, when the opening is being opened by the first lid and the second lid.

FIGS. 33A and 33B schematically show relation between a travel speed of a first cam 8 and a travel speed of a second cam 9, wherein FIG. 33A shows a condition when the opening 2a1 is closed by the first lid 4 and the second lid 5, and FIG. 33B shows a condition when the opening 2a1 is opened by the first lid 4 and the second lid 5.

In the display device 31 according to the third embodiment, when the a combiner 6 is not in use, the opening 2a1 is closed by the first lid 4 and the second lid 5 as shown in FIG. 31. Meanwhile, when the combiner 6 is in use, the opening 2a1 is opened, and the first lid 4 and the second lid 5 are retracted below the upper surface plate 2a as shown in FIG. 32, wherein the first lid 4 is located at an upper position, and the second lid 5 is located at a lower position.

A drive shaft 13 is inserted through the second cam 9 to move the second lid 5 as shown in FIGS. 33A and 33B, and the second cam 9 travels forward and rearward at the same speed as the drive shaft 13. Meanwhile, since the first cam 8 to move the first lid 4 is caused to travel by engagement with a pinion 13p fixed to the drive shaft 13, the first cam 8 travels at a speed equal to twice the speed of the drive shaft 13, that is, twice the speed of the second cam 9.

When the display device 31 becomes in use, if the first lid 4 is assumed to travel downward vertically for dimension h, then the second lid 5 which is retracted below the first lid 4 is assumed to travel downward vertically for dimension 2h as shown in FIG. 31.

Then, the first lid 4 and the second lid 5 travel rearward to be stored below the upper surface plate 2a of the upper case 2 such that the first lid 4 is retracted at the upper position and the second lid 5 is retracted at the lower position, whereby the opening 2a1 is opened.

In this connection, it is assumed that a horizontal travel distance of the first lid 4 is 2L, and a vertical travel distance thereof is h. Also, if the vertical travel distance of the first lid 4 is equal to a horizontal travel distance of the first cam 8, a travel distance of the first cam 8 to move the first lid 4 is 2L+h. Then, a travel distance of the second cam 9, which is ½ of the travel distance of the first cam 8 as shown in FIG. 33, is therefore h/2+L.

Meanwhile, since the second lid 5 travels for the distance 2h+L, if the vertical travel distance of the second lid 5 is equal to the horizontal distance of the second cam 9, then the travel distance of the second cam 9 to move the second lid 5 is 2h+L.

In the third embodiment, when the opening 2a1 is opened, the first lid 4 is retracted at the upper position and the second lid is retracted at the lower position unlike in the first embodiment, whereby the degree of design freedom of the display device 31 can be increased.

Travel Track of the First Cam 8 and the Second Cam 9 in the First Embodiment For the purpose of comparison with the third embodiment, description will be made of the travel track of the first cam 8 and the second cam 9 in the first embodiment.

Figure 34:
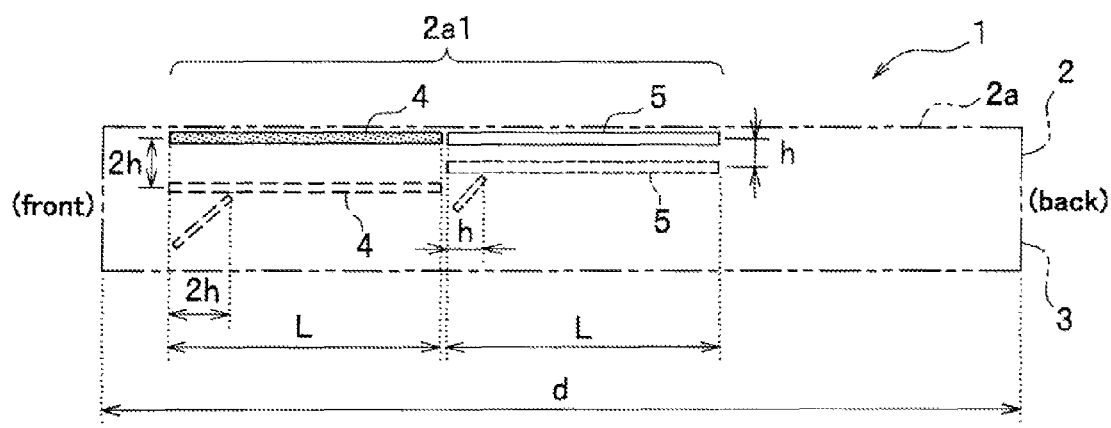
FIG. 34 is a schematic side view of the display device according to the first embodiment, when the opening is closed by the first lid and the second lid.
Figure 35:
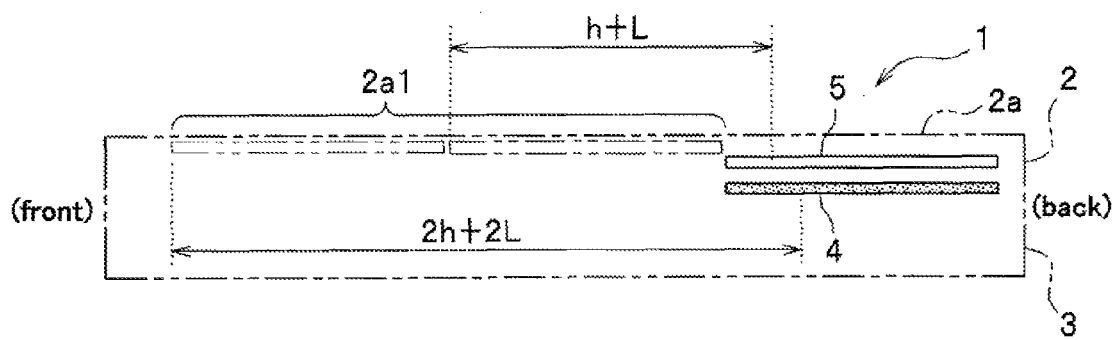
FIG. 35 is a schematic side view of the display device according to the first embodiment seen from the side, when the opening is opened and the first lid and the second lid are retracted inside the upper case.

FIG. 34 schematically shows the display device 1 according to the first embodiment viewed from a side, when the opening 2*a*1 is closed by the first lid 4 and the second lid 5. FIG. 35 schematically shows the display device 1 according to the first embodiment viewed from the side, when the opening 2*a*1 is opened, and the first lid 4 and the second lid 5 are retracted to be stored in the upper case 2.

In the display device 1 according to the first embodiment, when the combiner 6 is not in use, the opening 2*a*1 is closed by the first lid 4 and the second lid 5 as shown in FIG. 34. Meanwhile, when the combiner 6 is in use, the opening 2*a*1 is opened such that the first lid 4 and the second lid 5 are retracted below the upper surface plate 2*a* as shown in FIG. 35, wherein the first lid 4 is located at the lower position and the second lid 5 is located at the upper position unlike in the third embodiment.

When the display device 1 becomes in use, if the first lid 4 is assumed to travel at first downward vertically for the dimension 2*h* as shown in FIG. 34, the second lid 5 is retracted above the first lid 4 and therefore is assumed to travel downward vertically for the dimension h.

And, as shown in FIG. 35, the first lid 4 and the second lid 5 travel rearward to be retracted below the upper surface plate 2*a* of the upper case 2 thus opening the opening 2*a*1 such that the first lid 4 is located at the lower position and the second lid 5 is located at the upper position unlike in the third embodiment.

In this connection, if it is assumed that a horizontal travel distance of the first lid 4 is 2L, a vertical travel distance thereof is 2h, and that an inclination angle of the guide groove is 45 degrees, then a travel distance of the first cam 8 is 2L+2h. A travel distance of the second cam 9, which is equal to ½ of a travel distance of the first cam 8, is therefore h+L.

Meanwhile, since the second lid 5 travels for the distance h+L, if the inclined angle of the guide groove is set at 45 degrees, the travel distance of the second cam 9 to move the second lid 5 is h+L.

Compared with the third embodiment in which the travel distance of the second cam 9 is 2h+L, the travel distance of the second cam 9 is h+L in the first embodiment. Thus, the travel distance of the second cam 9 in the first embodiment is shorter by a distance h compared with in the third embodiment. A depth dimension d of the display device 1 depends on the travel distance of the second cam 9.

Accordingly, the first embodiment in which the first lid 4 is located at the lower position and the second lid 5 is located at the upper position for storage and in which the depth dimension d is shorter is more preferable compared to the third embodiment in which the first lid 4 is located at the upper position and the second lid 5 is located at the lower position for storage.

Also, in the third embodiment, the travel track of the first lid 4 intersects with the travel track of the second lid 5 as can be seen in FIGS. 31 and 32. Meanwhile, in the first embodiment, the travel track of the first lid 4 does not intersect with the travel track of the second lid 5 as can be seen in FIGS. 34 and 35. Thus, since the travel track of the first lid 4 does not intersect with the travel track of the second lid 5, the travel structure of the first lid 4 and the second lid 5 in the first embodiment is considered simple.

In view of this, the first embodiment in which the first lid 4 is located at the lower position and the second lid 5 is located at the upper position for storage is more preferable than the third embodiment in which the first lid 4 is located at the upper position and the second lid 5 is located at the lower position.

Fourth Embodiment

A fourth embodiment of the present invention will be described. In the fourth embodiment, detection of the rise up position of a combiner 6 is performed by an angle sensor 18, and detection of the retraction position of the combiner 6 is performed by a switch (not shown) unlike in the first embodiment.

Description will hereinafter be made of the fourth embodiment with reference to FIG. 18.

An angle detection gear member 6*k* having a partial gear 6*k*1 is fixed at a combiner support 6*s* to which the combiner 6 is fixed by a pan head small screw n3.

When the combiner 6 is retracted and not in use, the partial gear 6*k*1 of the angle detection gear member 6*k* of the combiner support 6*s* is not engaged with an angle detection gear 14*g* of a rotary circular plate 14.

When the partial gear 6*k*1 of the angle detection gear member 6*k* of the combiner support 6*s* is out of engagement, a boss 15*a* of a plate spring 15 is set in a notch 14*o* formed at the rotary circular plate 14, and this condition is defined as an initial angle of the rotary circular plate 14.

With the configuration described above, the combiner 6 which is retracted as shown in FIG. 18 is gradually raised up by the drive of a second motor 17, and while the combiner 6 is being raised up, the partial gear 6*k*1 of the angle detection gear member 6*k* of the combiner support 6*s* is set into engagement with the angle detection gear 14*g* of the rotary circular plate 14, and the notch 14*o* of the rotary circular plate 14 comes off from the boss 15*a* of the plate spring 15. And, the angle detection gear 14*g* of the rotary circular plate 14 is rotated together with the partial gear 6*k*1 of the angle detection gear member 6*k* of the combiner support 6*s*, and the rotation angle of the rotary circular plate 14 is detected by an angle sensor 18 thus detecting the rise up condition of the combiner 6.

Meanwhile, when the combiner 6 raised up is retracted in an opposite manner, the partial gear 6*k*1 of the angle detection gear member 6*k* of the combiner support 6*s* comes out of engagement with the angle detection gear 14*g* of the rotary circular plate 14 while the combiner 6 is being retracted. In this connection, the boss 15*a* of the plate spring 15 is set into the notch 14*o* formed at the rotary circular plate 14 thereby stopping the travel of the rotary circular plate 14. As a result, the rotary circular plate 14 is stopped at the initial angle.

Then, the combiner 6 is retracted for storage in upper and lower cases 2 and 3 by a reverse rotation of the second motor 17, the storage condition is detected by the switch (not shown), and thus the action of the second motor 17 is finished.

Subsequently, by the rotation drive of a first motor 7, a rack 12 is caused to travel from the condition shown in FIG. 7 in a direction indicated by the arrow α2.

According to the configuration of the fourth embodiment, the degree of design freedom of a display device 1 can be increased.

Other Embodiments

1. In the first to third embodiments described above, the combiner 6, on which a virtual image is projected, is used as a display portion, but the present invention is not limited to such a configuration, and the display portion may be replaced by other members than the combiner 6, such as a liquid crystal display (LCD).

2. In the description of the first to fourth embodiments, the inclined portion 9*n* formed at the front corner of the second cam 9 is used as a closing action portion of the second cam 9 but may be replaced by a member which has, for example, a curved shape rather than an inclined shape.

3. In the description of the first to fourth embodiments, the closing action portion is formed at the second cam 9 but may alternatively be formed at the first cam 8.

The present invention has been described with reference to specific embodiments but is not limited to the embodiments described above, and it is to be understood that the design can be changed as appropriate without departing from the spirit of the present invention and various alterations and modifications are possible within the scope of the present invention.

That is to say, the embodiments of the present invention can arbitrarily be modified within the scope where the spirit of the present invention is not changed.

Technical thought observed based on the first to fourth embodiments described above will hereinafter be described.

(Observation 1)

A display device is provided which includes: a display portion to display information; a chassis adapted to store the display portion and including an opening at an upper side thereof for allowing the display portion to protrude through; a cover including a plurality of lids adapted to cover the opening and each having a smaller surface area than the opening: and a cover opening and closing means adapted to open and close the plurality of lids, respectively, wherein a first condition is present in which the plurality of lids are overlapped with one another, and a second condition is present in which the plurality of lids close the opening.

(Observation 2)

A display device is provided which is configured as described in Observation 1 and which includes travel means to move the plurality of lids at respective different speeds, when the above described first condition is transferred to the second condition, or when the second condition is transferred to the first condition.

(Observation 3)

A display device is provided which is configured as described in Observation 2, in which the cover includes a first lid including first bosses and a second lid including second bosses, and which further includes: a first drive source provided in the chassis, wherein the travel means are rotated by power of the first drive source; a drive shaft to travel in a travel direction of the cover; a first travel body provided parallel to a side of the chassis and adapted to travel in the travel direction in accordance with a rotation action of the drive shaft and a travel action thereof in the travel direction; and a second travel body provided parallel to the side of the chassis and adapted to travel in the travel direction in accordance with the travel action of the drive shaft in the travel direction, wherein the first lid is engaged with the first travel body by the first boss, and the second lid is engaged with the second travel body by the second boss.

(Observation 4)

A display device is provided which is configured as described in Observation 3 and in which a first guide rail is provided at the side of the chassis and includes: a first horizontal portion extending in the travel direction; and a first vertical portion connected with the first horizontal portion and extending in a first direction intersecting with the travel direction, wherein the first travel body includes a first guide hole including a first inclined portion extending in a second direction intersecting with the travel direction, the first boss of the first travel body is engaged with the first guide rail and the first guide hole, and wherein the first lid is transferred from the first condition to the second condition and also is transferred from the second condition to the first condition in accordance with traveling of the first travel body moving in the travel direction.

(Observation 5)

A display device is provided which is configured as described in Observation 4 and in which a second guide rail is provided at the side of the chassis and includes: a second horizontal portion extending in the travel direction; and a second vertical portion connected with the second horizontal portion and extending in the first direction, wherein the second travel body includes a second guide hole including a second inclined portion extending in the second direction, and the second boss of the second travel body is engaged with the second guide rail and the second guide hole, and wherein the second lid is transferred from the first condition to the second condition and also is transferred from the second condition to the first condition in accordance with traveling of the second travel body moving in the travel direction.

(Observation 6)

A display device is provided which is configured as described in one of Observations 4 and 5 and in which an angle made between the first direction and the second direction is substantially 45 degrees.

(Observation 7)

A display device is provided which is configured as described in Observation 3 and which further includes a second drive source independent from the first drive source and adapted to raise up and retract the display portion.

(Observation 8)

A display device is provided which is configured as described in Observation 3 and in which the first drive shaft includes a pinion, and the first travel body includes a rack to engage with the pinion.

DESCRIPTION OF THE REFERENCE NUMERALS

1, 21, 31 display device
6 combiner (display portion)
2 upper case (storage member)
2$a$1 opening
3 lower case (storage member)
3$s$ tension coil spring (elastic body)
4 first lid (cover member, lid, cover member with a longer travel distance)
4$p$1 first front boss (first boss)
4$p$2 first rear boss (first boss)
5 second lid (cover member, lid, cover member with a shorter travel distance)
5$p$1 second front boss (second boss)
5$p$2 second rear boss (second boss)
7 first motor (travel control means, opening and closing drive structure, motor, first drive source)
7$a$ spur gear (first gear train)
7$h$1 worm wheel (first gear train)
7$h$2 first spur gear (first gear train)
7$w$ worm gear (first gear train)
8 first cam (travel control means, travel means, opening and closing drive structure)
8$a$ first front guide groove (first cam groove)
8$b$ first rear guide groove (first cam groove)
8$r$ rack (cam rack)
9 second cam (travel control means, travel means, opening and closing drive structure)
9$a$ second front guide groove (second cam groove)
9$b$ second rear guide groove (second cam groove)
9$n$ inclined portion (rotation opening and closing means, closing action portion)
9$s$ shaft insertion hole (through-hole)

10 lid rail
10a first guide groove (first lid rail groove)
10b second guide groove (second lid rail groove)
10r rack (lid rail rack)
12 rack (travel control means, opening and closing drive structure)
13 drive shaft
13p pinion
16l left torsion coil spring (biasing means)
16r right torsion coil spring (biasing means)
17 second motor (second drive source)
22 third lid (rotary cover member)
22s support member
22s1 drive boss (rotation opening and closing means)
k chassis (storage member)

What is claimed is:

1. A display device comprising:
   an opening;
   a combiner which, in use, is raised up through the opening with information displayed thereon and which, out of use, is retracted and stored;
   a plurality of divided lids including a first lid, a second lid, and a third lid which is disposed closer to an end portion of the opening than the first and second lids and which opens and closes a part of the opening by rotation action, which, in use, are configured to be folded up and stored by cover opening action to thereby open the opening and which, out of use, are configured to close the opening;
   an opening and closing drive structure including a pinion and rack that is arranged in parallel with the lids, configured to open and close the plurality of lids at respective different speeds;
   a support member configured to rotatably support the third lid and having a drive boss;
   an elastic member configured to bias the third lid in an opening direction; and
   a closing action portion configured, when the first and second lids are closed, to move the drive boss of the support member to thereby close the part of opening by the third lid.

2. A display device comprising:
   a display portion configured to display information;
   a storage member configured to store the display portion and comprising an opening at an upper side thereof for allowing the display portion to protrude through;
   a plurality of cover members which are-configured to cover the opening and which each have a smaller surface area than the opening; comprising a first cover member comprising first bosses and a second cover member comprising second bosses;
   a cover opening and closing drive structure including a pinion and a rack that is arranged in parallel with the cover member,
   wherein the drive structure is configured to open and close the plurality of cover members, respectively, wherein a first condition is present in which the plurality of cover members are overlapped with one another, and a second condition is present in which the plurality of cover members close the opening;
   a travel means configured to move the plurality of cover members at respective different speeds, one of when the first condition is transferred to the second condition, and when the second condition is transferred to the first condition
   and wherein the display device further comprises:
   a first drive source disposed in the storage member and configured to move the travel means;
   a drive shaft configured to travel in a travel direction of the cover member;
   a first cam disposed parallel to a side of the storage member and configured to travel in the travel direction in accordance with a rotation action of the drive shaft and a travel action thereof in the travel direction; and
   a second cam disposed parallel to the side of the storage member and configured to travel in the travel direction in accordance with the travel action of the drive shaft in the travel direction,
   wherein the first cover member is engaged with the first cam by the first bosses, and the second cover member is engaged with the second cam by the second bosses.

3. A display device according to claim 2, wherein a first guide grove is disposed on the side of the storage member and comprises:
   a first horizontal portion extending in the travel direction; and
   a first vertical portion connected with the first horizontal portion and extending in a first direction intersecting with the travel direction, wherein the first cam comprises a first guide hole comprising a first inclined portion extending in a second direction intersecting with the travel direction, the first boss of the first cam is engaged with the first guide groove and the first guide hole, and wherein the first cover member is transferred from the first condition to the second condition and also is transferred from the second condition to the first condition in accordance with traveling of the first cam moving in the travel direction.

4. A display device according to claim 3, wherein a second guide groove is disposed at the side of the storage member and comprises:
   a second horizontal portion extending in the travel direction; and
   a second vertical portion connected with the second horizontal portion and extending in the second direction intersecting with the travel direction,
   wherein the second cam comprises a second guide hole comprising a second inclined portion extending in the second direction, and the second boss of the second cam is engaged with the second guide-groove and the second guide hole, and
   wherein the second cover member is transferred from the first condition to the second condition and also is transferred from the second condition to the first condition in accordance with traveling of the second cam moving in the travel direction.

5. A display device according to claim 3, wherein an angle made between the first direction and the second direction is substantially 45 degrees.

6. A display device according to claim 2, wherein the display device further comprises a second drive source disposed independent from the first drive source and configured to raise up and retract the display portion.

7. A display device according to claim 2, wherein the first drive shaft comprises a pinion, and the first cam comprises a rack to engage with the pinion.

* * * * *